(12) United States Patent
Paulsen et al.

(10) Patent No.: US 10,571,503 B2
(45) Date of Patent: Feb. 25, 2020

(54) METHODS AND SYSTEMS FOR ESA METROLOGY

(71) Applicant: Rockwell Collins, Inc., Cedar Rapids, IA (US)

(72) Inventors: Lee M. Paulsen, Cedar Rapids, IA (US); Dana J. Jensen, Marion, IA (US); Joel T. Gillett, Solon, IA (US); Adrian A. Hill, Vinton, IA (US); Connor C. McBryde, Marion, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 0 days.

(21) Appl. No.: 15/885,362

(22) Filed: Jan. 31, 2018

(65) Prior Publication Data
US 2019/0235003 A1    Aug. 1, 2019

(51) Int. Cl.
*G01R 29/10*    (2006.01)
*H01Q 3/26*    (2006.01)

(52) U.S. Cl.
CPC .................. *G01R 29/10* (2013.01)

(58) Field of Classification Search
None
See application file for complete search history.

(56) References Cited

U.S. PATENT DOCUMENTS

| | | | | |
|---|---|---|---|---|
| 4,166,274 A | * | 8/1979 | Reudink | H01Q 3/2652 342/376 |
| 4,864,315 A | | 9/1989 | Mohuchy | |
| 5,572,219 A | * | 11/1996 | Silverstein | H01Q 3/005 342/165 |
| 6,480,153 B1 | * | 11/2002 | Jung | H01Q 3/267 342/174 |
| 7,132,979 B2 | * | 11/2006 | Langenberg | H01Q 3/267 342/368 |
| 9,705,611 B1 | | 7/2017 | West | |
| 2011/0102277 A1 | * | 5/2011 | Eibert | G01R 29/10 343/703 |
| 2011/0319034 A1 | * | 12/2011 | Boe | G01S 7/4017 455/67.14 |

OTHER PUBLICATIONS

European Search Report for EP Patent Application No. 18075017.6 dated Jul. 1, 2019. 9 pages.
Rafel H Medina et al: "Calibration and Validation of the CASA phased array antenna", Radar Conference (EURAD), 2012 9th European, IEEE, Oct. 31, 2012 (Oct. 31, 2012), pp. 614-617, XP032326785, ISBN: 978-1-4673-2471-7 *abstract* *p. 614-p. 616 *.

* cited by examiner

*Primary Examiner* — Mohammed Rachedine
(74) *Attorney, Agent, or Firm* — Donna P. Suchy; Daniel M. Barbieri

(57) ABSTRACT

Methods and Systems for testing phased antenna arrays include positioning a phased antenna array and a probe antenna at relative positions with respect to each other where one of them can operate as the transmitter and the other as the receiver. The transmitter can radiate a plurality of electromagnetic waves sequentially while the phased antenna array is steered or configured differently for each radiated electromagnetic. The receiver can receive, responsive to each radiated electromagnetic wave, a corresponding receive radio frequency (RF) signal. A processor can determine one or more performance parameters of the phased antenna array using the receive RF signals.

20 Claims, 11 Drawing Sheets

METHODS AND SYSTEMS FOR ESA METROLOGY

BACKGROUND

Antennas are typically tested before being put to use. Testing of an antenna is important for providing accurate measurements of the performance parameters of that antenna. It is very common and frequent that antennas do not perform as desired or as theoretically expected. As such, the antenna testing comes into play to measure or assess the actual performance metrics or parameters of antennas before using in the field.

For phased antenna arrays, performance parameters are typically measured over the operational bandwidth and temperature. Measuring the performance parameters involves over-the-air testing, typically done in the far field. Traditional antenna metrology requires expensive, large test stations—for example far-field anechoic chambers or compact range. The traditional approaches for performing factory acceptance testing are adequate in low-volume markets (e.g. fire-control fighter jet radar phased arrays) but are completely inadequate in high-volume markets (e.g. 5G base station phased arrays) or moderate-volume markets (e.g. airborne sitcom phased arrays). In particular, most traditional testing techniques are expensive, require relatively large testing space, and may not be adequate to perform some performance measurements.

Anechoic chambers, which are commonly used in testing phased antenna arrays and other antennas can be costly. The cost usually increases with size of the chamber. Also, most testing equipment can be costly and difficult to control or monitor. Such difficulty can make the testing process slow, therefore, adding more to the total cost.

SUMMARY

In one aspect, embodiments of the inventive concepts disclosed herein are directed to a method of testing phased antenna arrays. The method can include positioning a phased antenna array and a probe antenna at relative positions with respect to each other. The phased antenna array can include a plurality of antenna elements. Either the phased antenna array can act as a transmitting antenna and the probe antenna can act as a receiving antenna, or the probe antenna can act as the transmitting antenna and the phased antenna array can act as the receiving antenna. The method can include causing the transmitting antenna to radiate a plurality of electromagnetic waves sequentially. The method can include causing the phased antenna array to operate, during transmission of each electromagnetic wave of the plurality of electromagnetic waves, according to a corresponding configuration scheme. The corresponding configuration scheme can define a respective set of antenna elements that are active during the transmission of the electromagnetic wave or a respective phase coding scheme applied to the plurality of antenna elements during the transmission of the electromagnetic wave. The method can include receiving, by the receiving antenna, responsive to each radiated electromagnetic wave, a corresponding receive radio frequency (RF) signal. The method can include determining, for each antenna element of the plurality of antenna elements, corresponding amplitude and phase parameters using the receive RF signals. The method can include determining one or more performance parameters of the phased antenna array using the determined amplitude and phase parameters for the plurality of antenna elements.

In a further aspect, the antenna subarrays can include a group of antenna subarrays with corresponding antenna elements having a respective size and supporting a respective frequency subband. The antenna subarrays can include another group of antenna subarrays with corresponding antenna elements having a different size and supporting a different frequency subband.

In a further aspect, the method can include positioning the probe antenna at a near field location relative to the phased antenna array. The one or more performance parameters can include co-polarized antenna gain, cross-polarized antenna gain, co-polarized antenna directivity, cross-polarized antenna directivity, antenna beam width, radiated power, cross-polarization discrimination, antenna gain-to-noise-temperature, error vector magnitude, adjacent channel power ratio, pulse quality, one or more side lobe levels, signal-to-noise ratio (SNR), or a combination thereof.

In a further aspect, the method can include determining a far field response of the phased antenna array using the determined amplitude and phase parameters for each of the plurality of antenna elements. In a further aspect, causing the phased antenna array to operate according to a corresponding configuration scheme can include activating the plurality of antenna elements one at a time. Each antenna element can be activated to transmit an electromagnetic wave of the plurality of electromagnetic waves and the probe antenna can receive, responsive to transmission of the electromagnetic wave by the antenna element, the corresponding receive RF signal. Each antenna element can be activated to receive, responsive to transmission of an electromagnetic wave of the plurality of electromagnetic waves by the probe antenna, the corresponding receive RF signal. The method can further comprise determining, for each antenna element of the plurality of antenna elements, the corresponding amplitude and phase parameters using the corresponding receive RF signal received during activation of the antenna element In a further aspect, causing the phased antenna array to operate according to a corresponding configuration scheme can include phase steering the plurality of antenna elements, during transmission of each electromagnetic wave of the plurality of electromagnetic waves, according to a respective phase coding scheme. Each phase coding scheme can define a corresponding set of phase shifts or a corresponding set of time delays applied to the plurality of antenna elements during transmission of a corresponding electromagnetic wave of the plurality of electromagnetic waves. The method can further comprise transmitting each electromagnetic wave of the plurality of electromagnetic waves by the plurality of antenna elements phase steered according to the corresponding set of phase shifts or the corresponding set of time delays. The antenna probe can receive, responsive to transmission of the electromagnetic wave by the plurality of antenna elements, the corresponding receive RF signal. The method may comprise transmitting each electromagnetic wave of the plurality of electromagnetic waves by the probe antenna and the phased antenna array can receive, responsive to transmission of the electromagnetic wave by the antenna probe, the corresponding receive RF signal.

In a further aspect, causing the phased antenna array to operate according to a corresponding configuration scheme can include phase steering a group of active antenna elements of the plurality of antenna elements, during transmission of each electromagnetic wave of the plurality of electromagnetic waves, according to a respective phase coding scheme.

In a further aspect, the method can further include modifying the relative positions by causing the antenna probe or the phased antenna array to move along a predefined path during transmission of the plurality of electromagnetic waves.

In a further aspect, the method can include positioning at least two antenna probes with distinct polarizations, or positioning a single dual polarized antenna probe. In a further aspect, the method can include positioning a plurality of probe antennas operating at different center frequencies at various positions relative to the phased antenna array.

In a further aspect, the method can include applying a predefined phase offset to the plurality of antenna elements, and receiving one or more additional receive signals at an angle offset with respect to a main lobe of the receiving antenna.

In one aspect, embodiments of the inventive concepts disclosed herein are directed to a method of testing phased antenna arrays. The method can include positioning a phased antenna array including a plurality of antenna elements and a probe antenna at relative positions with respect to each other. Either the phased antenna array can act as a transmitting antenna and the probe antenna can act as a receiving antenna, or the probe antenna can act as the transmitting antenna and the phased antenna array can act as the receiving antenna. The method can include applying, to each antenna element of the plurality of antenna elements, a corresponding phase shift or a corresponding time delay to compensate for differences in signal propagation times between the probe antenna and each of the plurality of antenna elements. The method can include causing the transmitting antenna to radiate an electromagnetic wave. The method can include receiving, by the receiving antenna, a receive radio frequency (RF) signal responsive to radiating the electromagnetic wave. The method can include determining one or more performance parameters of the phased antenna array using the receive RF signal.

In a further aspect, the method can include positioning the probe antenna at a near field location relative to the phased antenna array. In a further aspect, the one or more performance parameters can include co-polarized antenna gain, cross-polarized antenna gain, co-polarized antenna directivity, cross-polarized antenna directivity, antenna beamwidth, radiated power, cross-polarization discrimination, antenna gain-to-noise-temperature, error vector magnitude, adjacent channel power ratio, pulse quality, one or more side lobe levels, and signal-to-noise ratio (SNR).

In a further aspect, the method can include positioning at least two antenna probes with distinct polarizations, or positioning a single dual polarized antenna probe. In a further aspect, the method can include positioning a plurality of probe antennas operating at different center frequencies at one or more positions relative to the phased antenna array.

In one aspect, embodiments of the inventive concepts disclosed herein are directed to a system for testing phased antenna arrays. The system can include a signal generator circuit communicatively coupled to a phased antenna array including a plurality of antenna elements or a probe antenna positioned at a relative position with respect to the phased antenna array. The signal generator circuit can generate one or more transmit radio frequency (RF) signals for transmission by the phased antenna array or the probe antenna. Either the phased antenna array can act as a transmitting antenna and the antenna probe can act as a receiving antenna, or the antenna probe can act as the transmitting antenna and the phased antenna array can act as the receiving antenna. The system can include a processor communicatively coupled to the signal generator circuit, the phased antenna array, and the probe antenna. The processor can cause the transmitting antenna to sequentially radiate a plurality of electromagnetic waves associated with the one or more transmit RF signals. The processor can cause the phased antenna array to operate, during transmission of each electromagnetic wave of the plurality of electromagnetic waves, according to a corresponding configuration scheme. The corresponding configuration scheme can define a respective set of antenna elements that are active during the transmission of the electromagnetic wave or a respective phase coding scheme applied to the plurality of antenna elements during the transmission of the electromagnetic wave. The processor can obtain, from the receiving antenna, responsive to each radiated electromagnetic wave, a corresponding receive RF signal, the receive RF signal received by the receiving antenna responsive to the radiated electromagnetic wave. The processor can determine, for each antenna element of the plurality of antenna elements, corresponding amplitude and phase parameters using the receive RF signals. The processor can determine one or more performance parameters of the phased antenna array using the determined amplitude and phase parameters for the plurality of antenna elements.

In a further aspect, the processor can be embedded within the phased antenna array.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

Figure 1:
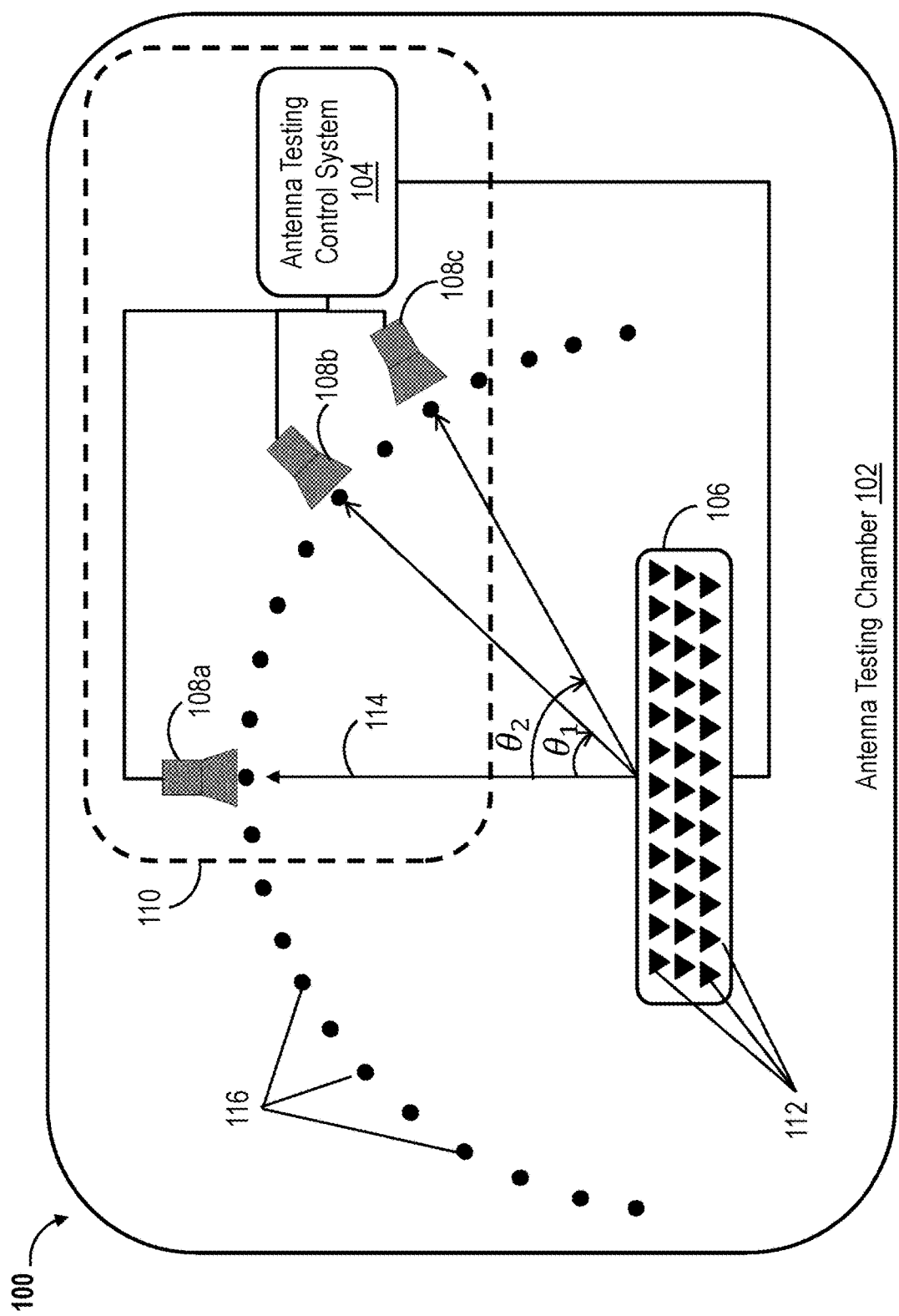
FIG. 1 shows a diagram illustrating an example embodiment of a phased antenna array testing environment, according to inventive concepts of this disclosure.

The details of various embodiments of the methods and systems are set forth in the accompanying drawings and the description below.

DETAILED DESCRIPTION

Before describing in detail embodiments of the inventive concepts disclosed herein, it should be observed that the inventive concepts disclosed herein include, but are not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

Methods and systems described herein allow phased antenna array testing methods that are accurate, relatively fast (e.g., compared to conventional testing techniques), efficient. While conventional antenna testing methods may allow for testing one or very few phased antenna arrays per day, the methods and systems described herein allow for testing many phased antenna arrays per day. For instance, the methods described below with regard to FIGS. 3 and 7 can allow for determining the radiation pattern of a phased antenna array in about seven seconds instead of hours. The increased testing speed allows for using a relatively smaller number of testing systems (or testing equipment) to test a given number (e.g., thousands) of phased antenna arrays, and therefore, reduces the testing space used. The reduction in testing equipment used reduces the testing cost and so does the reduction of testing space since anechoic chambers are very costly and their cost increases with their size.

Also, conventional antenna testing methods and systems usually employ moving mechanical parts (e.g., motors) that need to be maintained. These moving mechanical parts can add to the complexity of the testing methods and slow the testing process. Specifically, using a motor to rotate or move a robe antenna or a phased antenna array can be much slower and less accurate than steering antenna elements of the phased antenna array by applying a set of time delays or phase shifts.

Referring now to the drawings, FIG. 1 shows a diagram illustrating an example embodiment of a phased antenna array testing environment 100, according to inventive concepts of this disclosure. In brief overview, the phased antenna array testing environment 100 can include an antenna testing chamber 102, an antenna testing control system 104, a phased antenna array 106, and one or more probe antennas, such as probe antennas 108a-108c which are referred to hereinafter either individually or in combination as probe antenna(s) 108. The antenna testing control system 104, the phased antenna array 106, and the one or more probe antennas 108 can be arranged within the antenna testing chamber 102. The antenna testing control system 104 and the one or more probe antennas 108 can be viewed as forming a phased antenna array testing system 110 for testing the phased antenna array 106. While FIG. 1 shows a single phased antenna array 106 being tested, the phased antenna array testing system 110 can be used to test a plurality of phased antenna arrays 106 as discussed in further detail below.

The antenna testing chamber 102 can include a radio frequency (RF) anechoic chamber. A RF anechoic chamber can be a room designed to completely, or substantially, absorb reflections of electromagnetic waves radiated by the phased antenna array 106 or the one or more probe antennas 108. For instance, the walls, ceiling and floor of the RF anechoic chamber can be made of or lined with electromagnetic wave absorbing material. The walls and ceiling of the RF anechoic chamber can also be designed to block electromagnetic waves in the surrounding environment from penetrating into anechoic chamber. The testing chamber 102 can be sized to host the phased antenna array testing system 110 and the phased antenna array(s) 106 to be tested. For instance, the size of the testing chamber 102 can be defined based on the sizes of components of the phased antenna array testing system 110, the size of the phased antenna array(s) 106 to be tested, the number of phased antenna array(s) to be tested (e.g., per a given time duration), the distance(s) between the phased antenna array(s) 106 and the probe antenna(s) 108, or a combination thereof.

In some implementations, the phased antenna array testing system 110 and the phased antenna array(s) 106 to be tested can be arranged in open space (or outdoor). Specifically, embodiments for testing phased antenna arrays described in this disclosure can be performed in an open space environment (not within a testing chamber 102). For instance, an electromagnetic wave absorbing material can be laid on a portion of the ground between the phased antenna array(s) 106 and the probe antenna(s) 108 to prevent or mitigate reflections of the ground. Other techniques may be employed to eliminate or mitigate background noise within the open space testing environment.

An operator can use the phased antenna array testing system 110 to test the phased antenna array 106 by measuring one or more performance parameters of the phased antenna array 106. The phased antenna array 106 can be an electronically scanned array (ESA) antenna or an active ESA (AESA) antenna. The phased antenna array 106 can include a plurality of antenna elements (also referred to as radiating elements) 112 that form an array. The array of antenna elements 112 can be a one-dimensional (1-D) array, a two-dimensional (2-D) array, or a three-dimensional (3-D) array. Each of the antenna elements 112 can act as a separate antenna configured to receive, transmit, or alternate between transmitting and receiving radio frequency (RF) signals. The phased antenna array 106 can include a network of RF amplifiers and phase shifters (or time delay elements) communicatively coupled to the plurality of antenna elements 112. The network of RF amplifiers and phase shifters (or time delay elements) can allow for steering of beams received or transmitted by the phased antenna array 106.

When manufactured, the phased antenna array 106 can be designed to have specific performance parameters (or radio characteristics) such as gain (G), directivity, radiation pattern, beam width, radiated power (or effective isotropic radiated power (EIRP)), cross correlation discrimination, gain-to-noise-temperature (G/T), error vector magnitude (EVM), adjacent channel power ratio (ACPR), pulse quality, side lobe levels, signal-to-noise ratio (SNR), or a combination thereof. However, due to manufacturing and/or design errors, the phased antenna array 106 may perform as desired and the actual performance parameters of the phased antenna array 106 may be different from the corresponding theoretical performance parameters defined, for example, during the design process of the phased antenna array 106. The phased antenna array testing processes described herein allow for measuring the actual performance parameters (or radio characteristics) of the phased antenna array 106.

During the testing processes described herein, the phased antenna array 106 can operate (or act) as transmitting antenna while the probe antenna(s) 108 can operate as receiving antenna(s), or the probe antenna(s) 108 can operate as transmitting antenna(s) while the phased antenna array 106 can operate (or act) as receiving antenna. For instance, the antenna testing control system 104 can cause a probe antenna 108 to radiate electromagnetic waves, and the phased antenna array 106 can receive, responsive to the transmission of the electromagnetic waves, corresponding RF signals. The antenna testing control system 104 may cause the phased antenna array 106 to radiate specific electromagnetic waves, and the probe antenna(s) 108 can receive, responsive to the transmission of the electromagnetic waves, corresponding receive RF signals. The antenna testing control system 104 can determine (or compute) one or more actual performance parameters of the phased antenna array 106 based on the received RF signals.

The probe antenna(s) 108 can include a horn antenna, a loop probe antenna, a rectangular antenna, a dipole antenna probe, or other type of antenna known to a person skilled in the art. The probe antenna(s) 108 can be single polarized or dual polarized. The one or more probe antenna(s) 108 may be arranged at fixed position(s) relative to the phased antenna array 106. The one or more probe antenna(s) 108 may be arranged or positioned at different angles with respect to an axis 114 that is orthogonal to a front surface (planar or curved) of the phased antenna array 106 along which the antenna elements 112 are arranged. For instance, probe antenna 108a can be arranged at angle $\theta_0=0°$, the probe antenna 108b can be arranged at angle $\theta_1=45°$, and the probe antenna 108b can be arranged at angle $\theta_2=60°$. The points 116 indicate can be indicative of various angles or positions along which the one or more probe antennas 108 may be arranged. The axis 114 may be pointing to (or passing through) a center point of the phased antenna array 106. The angles with respect to the axis 114 (or the points 116) at which the probe antennas 108 may be positioned can be defined in a three-dimensional (3D) space. The points 116 defining potential angles, relative to the axis 114, at which (or along which) the probe antennas 108 can be positioned or arranged can form a half sphere or a two-dimensional (2D) plane.

Figure 2A:
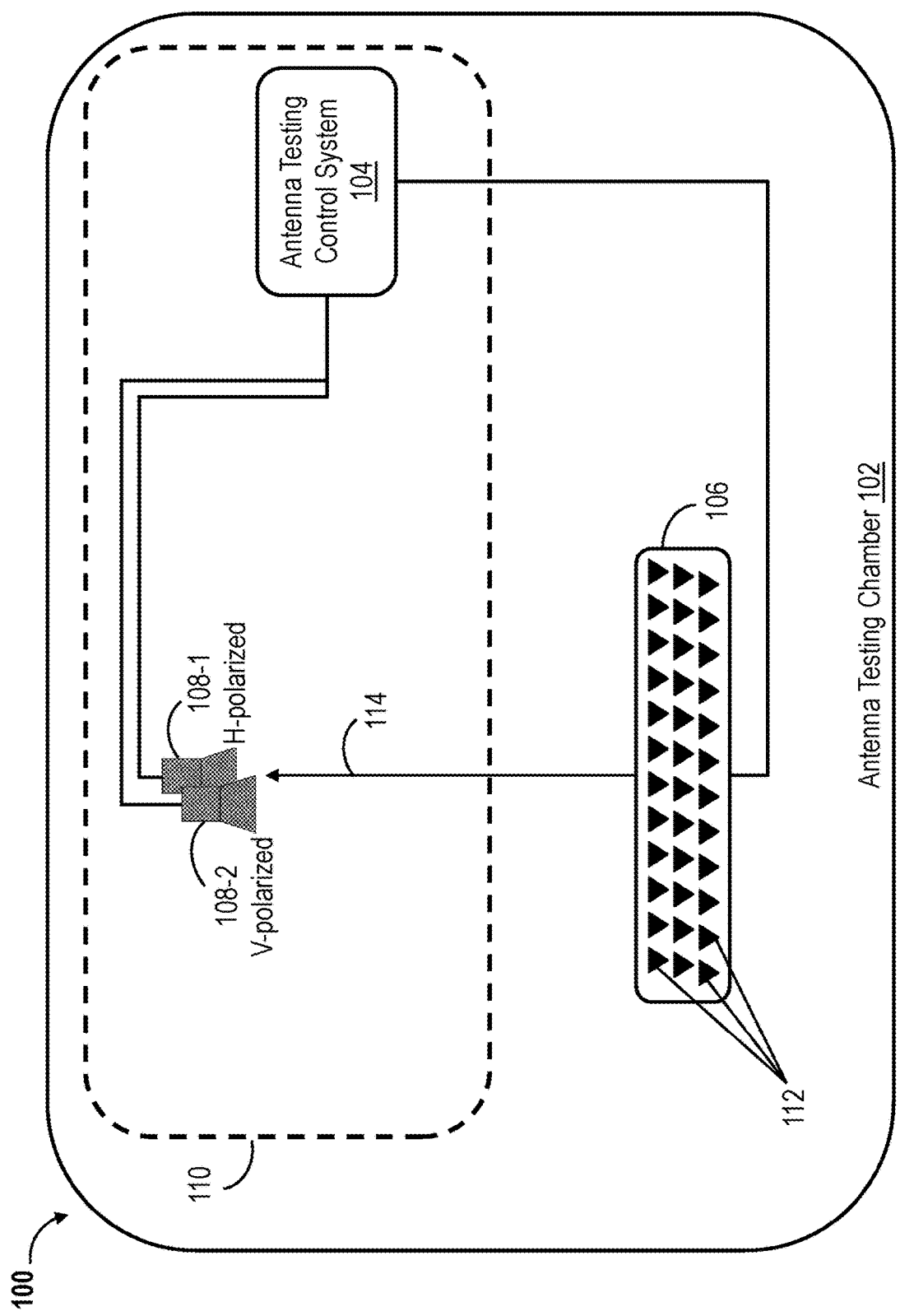
FIGS. 2A-C show block diagrams illustrating example embodiments of various WSA antenna arrays with distinct example beamformer circuits, according to inventive concepts of this disclosure.
Figure 2B:
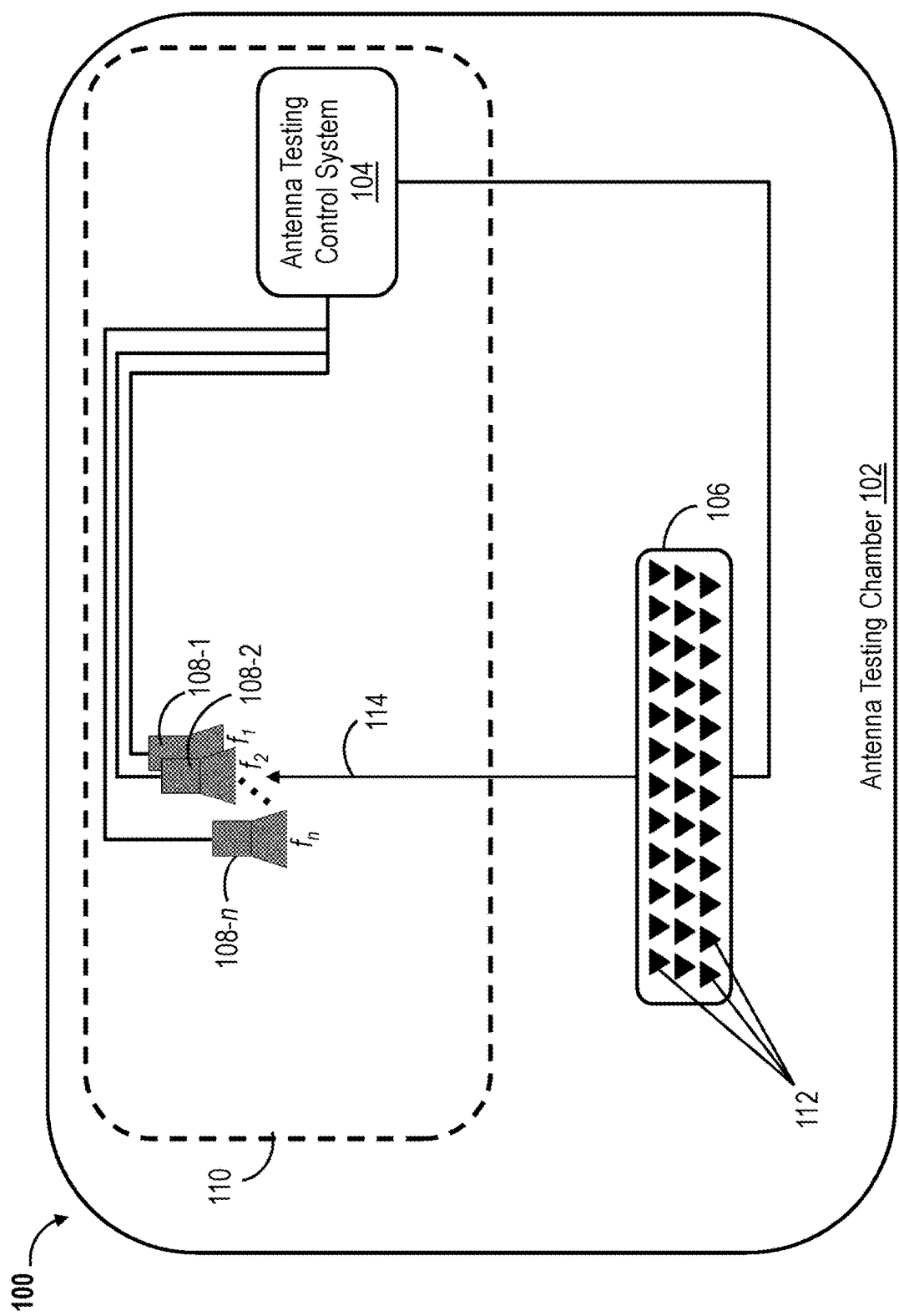
Figure 2C:
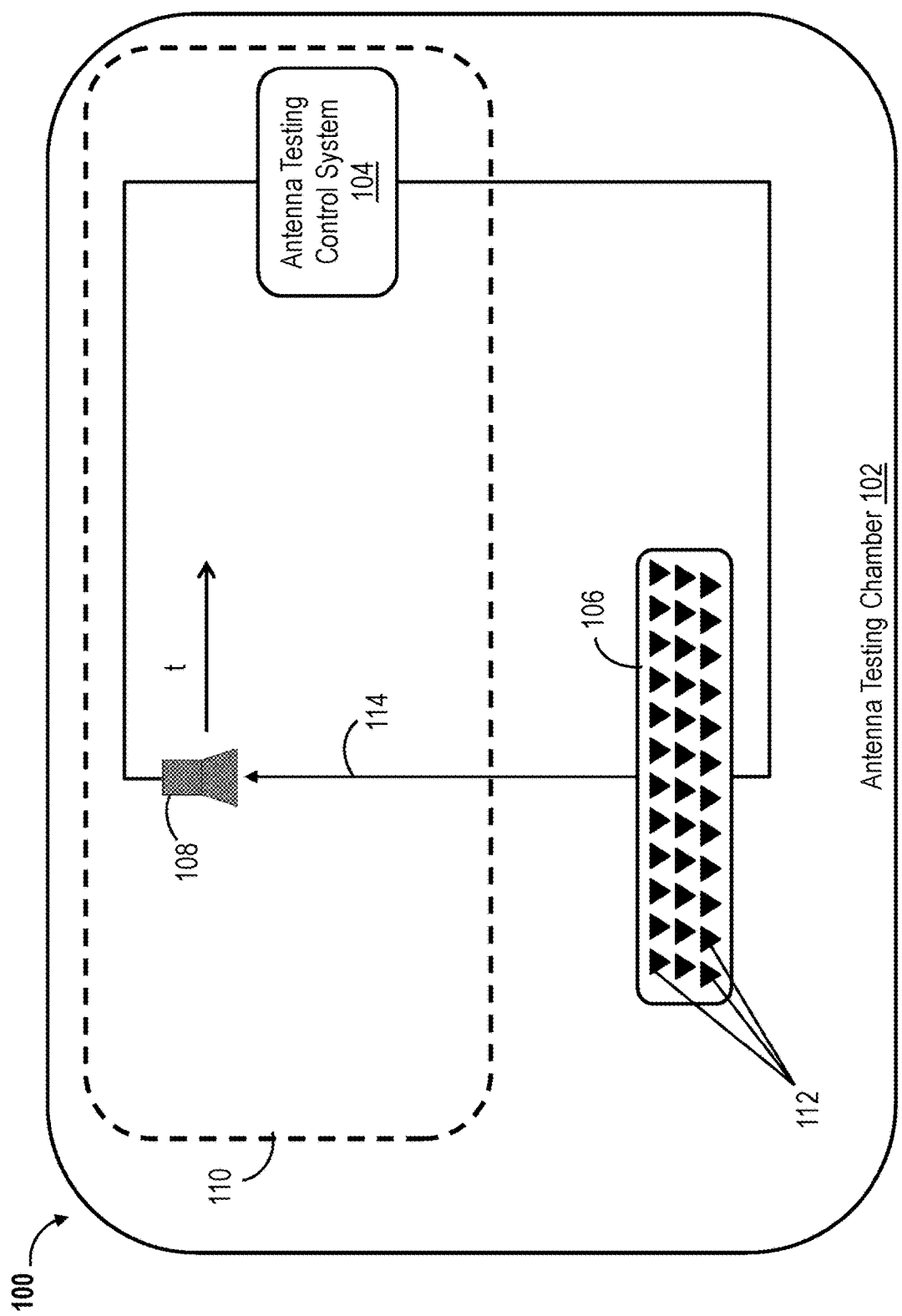

Referring to FIGS. 2A-2C, various arrangements of probe antennas 108 are illustrated, according to inventive concepts of this disclosure. As illustrated in FIG. 2A, the phased antenna array testing system 110 can include a horizontally polarized probe antenna 108-1 and a vertically polarized probe antenna 108-2, or more generally at least two differently polarized probe antennas. The probe antennas 108-1 and 108-2 are also referred to hereinafter individually or collectively as probe antenna(s) 108. The differently polarized probe antennas 108-1 and 108-2 may be arranged or positioned relatively close to each other (e.g., with corresponding angles relative to the axis 114 that are different by 0° to 3° or 0° to 5°) or substantially apart from each other (e.g., with corresponding angles relative to the axis 114 that are different by 10° or more). The differently polarized probe antennas 108-1 and 108-2 may be positioned at different altitudes (e.g., relative to the ground or the floor of the antenna testing chamber 102) or along the same altitude. The differently polarized probe antennas 108-1 and 108-2 allow for radiating or receiving dual polarized electromagnetic waves and, therefore, measuring performance parameters that are associated with distinct polarization components of the phased antenna array 106. The phased antenna array testing system 110 may include multiple pairs of differently polarized probe antennas.

Referring to FIG. 2B, the phased antenna array testing system 110 can include a plurality of probe antennas 108-1 through 108-n (referred to herein individually or in combination as probe antenna(s) 108) operating at different frequency bands associated with different center frequencies $f_1$, $f_2$, ..., $f_n$, where n is an integer greater than 1. Each probe antenna 108-i, where i=1, 2, ..., n, can be configured to operate at a corresponding center frequency $f_i$ of the frequencies $f_1, f_2, ..., f_n$. The probe antennas 108-1 through 108-n can be arranged or positioned relatively close to each other (e.g., with corresponding angles relative to the axis 114 that are different by 0° to 3° or 0° to 5°) or substantially apart from each other (e.g., with corresponding angles relative to the axis 114 that are different by 10° or more). The probe antennas 108-1 through 108-n may be positioned at different altitudes (e.g., relative to the ground or the floor of the antenna testing chamber 102) or along the same altitude. The phased antenna array testing system 110 may include a plurality of n-tuples of probe antennas (such as the n-tuple 108-1 through 108-n). For instance, at least two of the n-tuples of probe antennas can be polarized differently (e.g., one n-tuple can be horizontally polarized and another can be vertically polarized). Probe antennas 108-i operating at a given center frequency $f_i$ can be positioned at different locations (e.g., at different angles with respect to axis 114). The use of probe antennas 108-1 through 108-n operating at distinct frequency bands allows for radiating or receiving electromagnetic waves at different frequencies and assessing the performance parameters of the phased antenna array 106 over a wide frequency band (e.g., the combination of the frequency bands at which the probe antennas 108-1 through 108-n operate). The use of probe antennas 108-1 through 108-n operating at distinct frequency bands can allow determining the operating frequency band of the phased antenna array 106.

Referring to FIG. 2C, the phased antenna array testing system 110 can include a probe antenna 108 configured to move relative to the phased antenna array 106. A positioning system (not shown in FIGS. 1 and 2A-2C) can cause the probe antenna 108 to move, for example, along a predefined path (e.g., one or more straight lines or curves) or between predefined positions (e.g., positions indicated by points 116 in FIG. 1). The positioning system may cause the phased antenna array 106, or both probe antenna 108 and the phased antenna array 106, to move according to corresponding predefined path(s) or between corresponding predefined positions. Using a moving probe antenna 108 and/or a moving phased antenna array 106 can facilitate measuring performance parameters for a plurality of phased antenna arrays 106 or measuring additional performance parameters (e.g., radiation pattern or one or more side lobe levels) of a phased antenna array 106. For instance, when testing a plurality of phased antenna arrays 106, the antenna testing control system 104 may cause the phased antenna arrays 106 to be activated one at a time and cause the probe antenna 108, or the plurality of phased antenna arrays 106, to move according to a predefined motion pattern, for example, such that the active phased antenna array 106 is positioned at a predefined location relative to the probe antenna(s) 108. For example, the antenna testing control system 104 may (1) cause the phased antenna arrays 106 to be displaced, along a predefined path, by a specific distance, (2) activate the phased antenna array 106 located at a specific position, (3) cause radiation of electromagnetic waves between the active phased antenna array and the probe antenna(s) 108, and (4) repeat the steps (1) through (4) until all phased antenna arrays 106 are activated for testing. In another example, the antenna testing control system 104 may cause the probe antenna 108 to move according to a plurality of predefined displacement and activate a distinct phased antenna array 106 after each displacement until all phased antenna arrays 108 are tested.

Other arrangements of probe antennas 108 are also contemplated by the current disclosure. For example, the phased antenna array testing system 110 can include one or more probe antennas 108 according to a combination of the arrangement discussed above with regard to FIGS. 2A-2C. For instance, the phased antenna array testing system 110 can include at least a pair of differently polarized probe antennas 108 that are configured to move relative to the phased antenna array 106. The phased antenna array testing system 110 can include an n-tuple of probe antennas 108 that are configured to operate at different frequency bands and move relative to the phased antenna array 106. The phased antenna array testing system 110 can include at least two n-tuples of probe antennas (with probe antennas 108 in each n-tuple operating at different frequency bands) that are polarized differently (e.g., one n-tuple can have horizontal polarization and another can have a vertical polarization). The at least two n-tuples of probe antennas may be configured to move relative to the phased antenna array 106.

Referring back to FIG. 1, the antenna testing control system 104 can be communicatively coupled to the phased antenna array(s) 106 and the probe antenna(s) 108. The antenna testing control system 104 can include a combination of one or more electronic devices and one or more electric/electronic circuits. For instance, the antenna testing control system 104 can include a signal generator circuit, a network analyzer, a signal analyzer, a controller, a processor, a memory, a computing device, or a combination thereof. The antenna testing control system 104 can control electromagnetic wave radiation by the phased antenna array(s) 106 or the probe antenna(s) 108. For example, the antenna testing control system 104 can generate and provide RF signals to be transmitted as electromagnetic waves by the phased antenna array(s) 106 or the probe antenna(s) 108. The antenna testing control system 104 can control configuration schemes (or beam steering) of the phased antenna array(s) 106. The antenna testing control system 104 can send instructions to the phased antenna array 106 indicative of a configuration scheme (or phase configuration scheme). A configuration scheme (or a phase configuration scheme) can be indicative of (or can define) a group of antenna elements 112 of the phased antenna array 106 to be activated, phase shifts (or time delays) for various antenna elements 112 (e.g., all the antenna elements 112 or a group of antenna elements to be activated), attenuations or power amplifications values for various antenna elements 112, or a combination thereof. The antenna testing control system 104 can control the order and timing according to which the phase configuration schemes are implemented by the phased antenna array 106.

The antenna testing control system 104 can obtain RF signals received by the receiving antenna(s) (the probe antenna(s) 108 or the phased antenna array 106) and process the received RF signals received to determine or compute performance parameters of the phased antenna array 106. The antenna testing control system 104 can calculate the performance parameters of the phased antenna array 106 and provide the calculated performance parameters for storage in a memory or remote database, or for display on a display device communicatively coupled to the phased antenna array testing system 110. may also be communicatively coupled to a positioning system for controlling positions of the phased antenna array(s) 106 and the probe antenna(s) 108.

The antenna testing control system 104 can further include a positioning system (not shown in FIG. 1). The positioning system can be communicatively coupled to the antenna testing control system 104. The positioning system can include one or more mechanical structures for mechanically supporting the phased antenna array 106 or the probe antenna(s) 108. The positioning system can include a motor, wheels, or other mechanical components to cause the phased antenna array 106 or the probe antenna(s) 108 to automatically move between different positions or along a predefined path. For example, the positioning system can receive instructions (or signals indicative of instructions) from the antenna testing control system 104 and cause the phased antenna array 106 or the probe antenna(s) 108 to move between different predefined positions or along a predefined path, for example, as described above.

Figure 3:
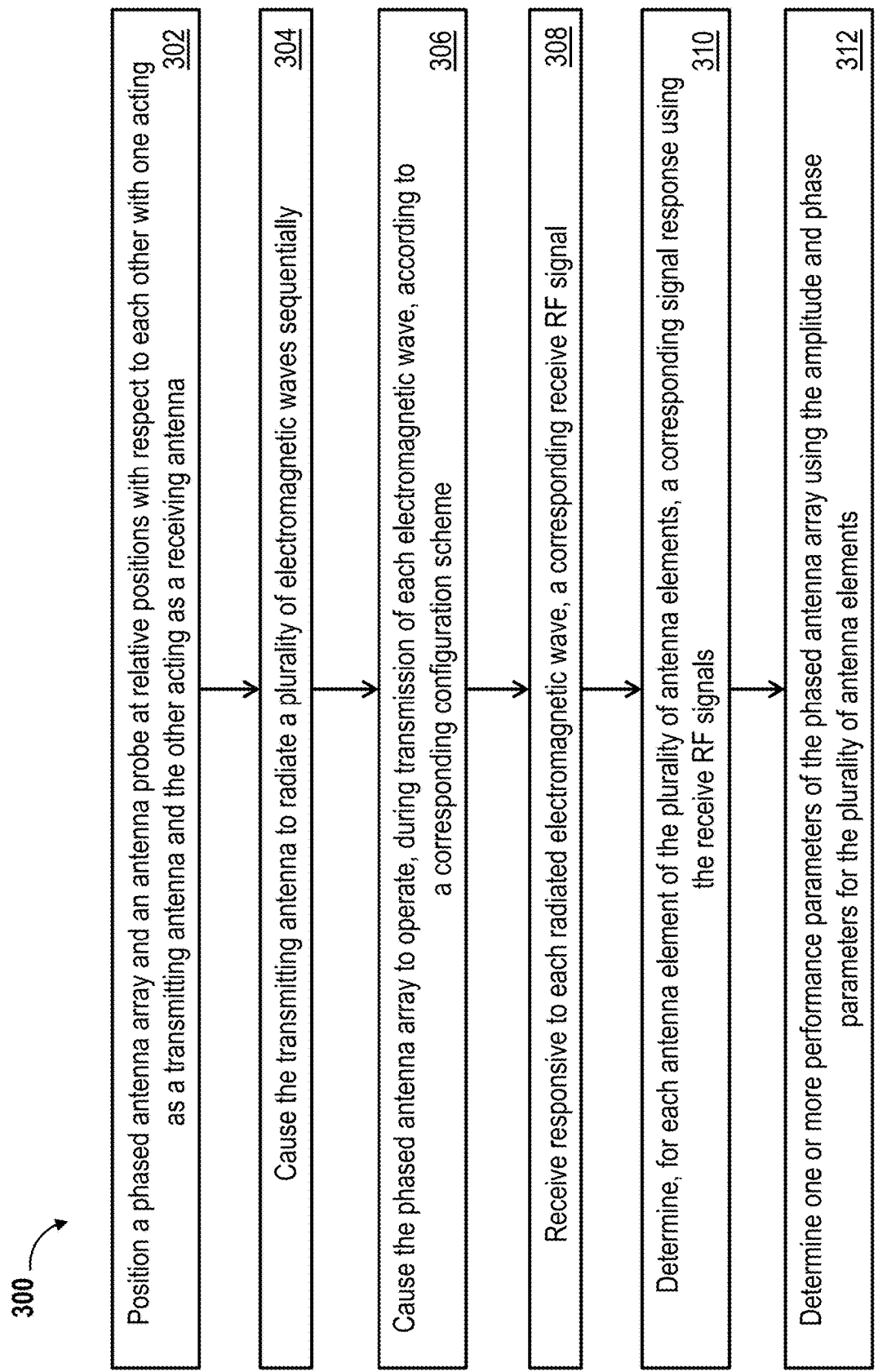
FIG. 3 shows a flowchart illustrating a method of testing phased antenna arrays, according to inventive concepts of this disclosure.

Referring to FIG. 3, a flowchart illustrating a method 300 of testing phased antenna arrays is shown, according to inventive concepts of this disclosure. In brief overview, the method 300 can include positioning a phased antenna array and an antenna probe at relative positions with respect to each other with one of them acting as a transmitting antenna and the other acting as a receiving antenna (BLOCK 302), and causing the transmitting antenna to radiate a plurality of electromagnetic waves sequentially (BLOCK 304). The method 300 can include causing the phased antenna array to operate, during transmission of each electromagnetic wave of the plurality of electromagnetic waves, according to a corresponding configuration scheme (BLOCK 306), receiving, by the receiving antenna, responsive to each radiated electromagnetic wave, and one or more corresponding receive radio frequency (RF) signals (BLOCK 308). The method 300 can include determining, for each antenna element of the plurality of antenna elements, a corresponding signal response using the receive RF signals (BLOCK 310), and determining one or more performance parameters of the phased antenna array using the determined signal responses for the plurality of antenna elements (BLOCK 312).

The method 300 can include positioning a phased antenna array 106 and an antenna probe 108 at relative positions with respect to each other with one of them acting as a transmitting antenna and the other acting as a receiving antenna (BLOCK 302). During the process of testing the phased antenna array 106, the phased antenna array 106 can act a transmitting antenna (while the probe antenna 108 can act as the receiving antenna) or as a receiving antenna (while the probe antenna 108 can act as the transmitting antenna). Under the principal of reciprocity, the receive and transmit properties of the phased antenna array 106 are identical. For instance, the radiation pattern of the phased antenna array 106 is the same in the transmit mode and the receive mode. Accordingly, when measuring the performance parameters of the phased antenna array 106, the phased antenna array can be arranged to operate as the transmitting antenna or the receiving antenna.

The antenna testing control system 104 can include, or can have access to, a testing schedule (or testing plan). The testing schedule can include indications of which entity among the phased antenna array 106 and the probe antenna 108 to act as the transmitting antenna and which entity to act as the receiving entity, the number of probe antennas 108 used, the relative locations of the phased antenna array 106 and the probe antenna(s) 108, a sequence of transmit RF signals to be transmitted (e.g., as radiated electromagnetic waves), timing information (e.g., time of transmission of each transmit RF signal or time intervals between successive transmissions of transmit RF signals), a plurality of configuration schemes of the phased antenna array, motion information (e.g., where and/or when the probe antenna 108 or the phased antenna array 106 is/are to be moved), or a combination thereof. The antenna testing control system 104 can include, or can have access to, indications of properties of the probe antenna 108 (e.g., performance parameters, geometry parameters such as size and shape, type of probe antenna 108, or a combination thereof). The antenna testing control system 104 can include, or can have access to, indications of design properties of the phased antenna array 106, such as the number of antenna elements 112 in the phased antenna array 106, the arrangement of the antenna elements 112 (e.g., number of rows and columns in the array and the number of antenna elements in each row or column), the spacing between the antenna elements 112, positions of the antenna elements in the three-dimensional space, the orientations of the antenna elements, the shape of the phased antenna array 106 (e.g., planar or curved), or a combination thereof.

At the start of the process of testing the phased antenna array 106, a user (e.g., a technician) may manually position or mount the phased antenna array 106 and the probe antenna 108 on corresponding mechanical support elements. The mechanical support elements can be positioned (e.g., fixed) at predefined testing positions. The positions of the mechanical support elements can be adjustable, and the antenna testing control system 104 can instruct the positioning system to move probe antenna 108, the phased antenna array 106, or the corresponding mechanical support elements to predefined positions at which the phased antenna array 106 and the probe antenna 108 are to be tested. The phased antenna array 106 can be positioned to face the probe antenna 108 (or one of the probe antennas 108 if more than one is used), for example, as illustrated in FIG. 1.

Positioning the probe antenna 108 can include positioning the probe antenna 108 at a near field location relative to the phased antenna array 106. For instance, the distance between the phased antenna array 106 and the probe antenna 108 can be less than the dominant wavelength λ, of the transmitted RF signal (or radiated electromagnetic wave), less than 2×λ, less than 3×λ, or less than 5×λ. Such arrangement can allow for using a relatively small antenna testing chamber 102. In some cases, the user or the positioning system may position the probe antenna 108 at a far field location relative to the phased antenna array 106. In such cases, the distance between the phased antenna array 106 and the probe antenna 108 may be, for example, greater than 5×λ, greater than 10×λ, or greater than some other predefined distance.

Positioning the probe antenna 108 can include positioning a single dual polarized probe antenna 108 or positioning at least two probe antennas 108 with distinct polarizations (e.g., including one horizontally polarized probe antenna and one vertically polarized probe antenna) as discussed above with regard to FIG. 2A. For instance, the user or the positioning system can position a pair of antennas 108-1 and 108-2 that are distinctly polarized or a plurality of such pairs as discussed above with regard to FIG. 2A. Using a dual polarized probe antenna 108 or a pair of distinctly polarized probe antennas, such as probe antennas 108-1 and 108-2 of FIG. 2A, can allow for assessing the co-polarized and cross-polarized response or performance of the phased antenna array 106.

Positioning the probe antenna 108 can include positioning a plurality or probe antennas 108 at different positions relative to the phased antenna array 106 as discussed above with regard to FIG. 1. The plurality of probe antennas may include one or more n-tuples each of which associated with n distinct operating center frequencies $f_1, f_2, \ldots, f_n$, as discussed above with regard to FIG. 2B. Using a plurality of probe antennas operating at various center frequencies allows for assessing the performance parameters of the phased antenna array 106 over a relatively wide frequency band. For example, when using a single probe antenna 108, the testing of the phased antenna array 106 is constrained to the operating frequency band of that probe antenna 108. In some cases, the probe antenna(s) 108 and/or the phased antenna array 106 may be configured to move as discussed above with regard to FIG. 2C.

The method 300 can include causing the transmitting antenna to radiate a plurality of electromagnetic waves sequentially (BLOCK 304). The antenna testing control system 104 can send instructions to the transmitting antenna (the phased antenna array 106 or the probe antenna(s) 108) to cause the transmitting antenna to radiate each of the plurality of electromagnetic waves, for example, according to the testing schedule. The antenna testing control system 104 may send a separate instruction or command for each electromagnetic wave to be radiated by the transmitting antenna, or send one instruction commanding the transmitting antenna to transmit or radiate the electromagnetic waves according to a specified time schedule. The plurality of electromagnetic waves may correspond to a single transmit RF signal or a plurality of distinct transmit RF signals (e.g., transmit RF signals associated with distinct bandwidths or center frequencies). For example radiating the plurality of electromagnetic waves may include the transmitting antenna transmitting a single transmit RF signal repeatedly at multiple time instances, transmitting time-shifted versions of the single transmit RF signal at the multiple time instances, or transmitting distinct transmit RF signals at the multiple time instances. In general, the antenna testing control system 104 can control the transmit RF signal(s) to be transmitted by the transmitting antenna, the radiation time of each electromagnetic wave, the order according to which the plurality of electromagnetic waves are transmitted, or a combination thereof.

In the case where multiple probe antennas 108 acting as transmitting antennas are used (e.g., as discussed with regard to FIGS. 1, 2A and 2B), the probe antennas 108 may transmit simultaneously or sequentially, one at a time. Also, if a moving probing antenna 108 (e.g., as discussed with regard to FIG. 2C) is used as the transmitting antenna, the probe antenna 108 may perform one or more transmissions while in one location, move to another location to perform one or more other transmissions, then to a third location and so on and so forth. The probe antenna 108 may transmit (or radiate) electromagnetic waves while moving. The antenna testing control system 104 can have access to the location of the moving probe antenna 108 (or the location of a moving phased antenna array 106) at each instance an electromagnetic wave is radiated by the transmitting antenna or received by the receiving antenna.

The method 300 can include causing the phased antenna array 106 to operate, during transmission of each electromagnetic wave of the plurality of electromagnetic waves, according to a corresponding configuration scheme (BLOCK 306). Each configuration scheme can be indicative of the antenna elements 112 of the phased antenna array 106 (e.g., all or a subset of the antenna elements 112) to be activated, the phase shift (or time delay) to be applied to each antenna element, the power amplification to be applied to each antenna element 112, or a combination thereof. Each configuration scheme can be associated with a corresponding electromagnetic wave radiated by the transmitting antenna. The antenna testing control system 104 may send a separate instruction to the phased antenna array 106 for each configuration scheme to be applied (e.g., prior to radiating the corresponding electromagnetic wave by the transmitting antenna), or may send one instruction indicative of the plurality of the configuration schemes and a time schedule according to which to apply each of the configuration schemes.

In the case where the phased antenna array 106 operates as the transmitting antenna, the phased antenna array 106 may apply or implement each configuration scheme prior to radiating the corresponding electromagnetic wave. For instance, the phased antenna array 106 can receive an indication of a transmit RF signal and an indication of a configuration scheme. The phased antenna array 106 can apply the configuration scheme (e.g., by activating one or more antenna elements 112, applying to one or more antenna elements 112 corresponding phase shifts or time delays, applying to one or more antenna elements 112 corresponding power amplifications, or a combination thereof), and transmit the transmit RF signal by each of the active antenna elements 112. The electromagnetic wave radiated or transmitted by the phased antenna array 106 can be the sum of the waves radiated/transmitted by the active antenna elements 112. The phased antenna array 106 can then apply another configuration scheme and radiate a new electromagnetic wave as each of the now active antenna elements 112 transmits the same (or another) transmit RF signal. The phased antenna array 106 can apply a different configuration scheme for each electromagnetic wave to be transmitted/radiated.

In the case where the phased antenna array 106 operates as the receiving antenna, the phased antenna array 106 may apply or implement each configuration scheme prior to (or while) the probe antenna(s) 108 radiating the corresponding electromagnetic wave. For instance, the antenna testing control system 104 can instruct the probe antenna 108 to transmit or radiate an electromagnetic wave (e.g., by providing an indication of a transmit RF signal) and instruct the phased antenna array 106 to apply a configuration scheme. The phased antenna array 106 can apply the configuration scheme (e.g., by activating one or more antenna elements 112, applying to one or more antenna elements 112 corresponding phase shifts or time delays, applying to one or more antenna elements 112 corresponding power amplifications, or a combination thereof) prior to the start of transmission or radiation of the electromagnetic wave by the probe antenna 108. The phased antenna array 106 (or active antenna elements 108 thereof) can receive the radiated electromagnetic wave while operating according to the applied configuration scheme. The phased antenna array 106 can then apply another configuration scheme to receive another electromagnetic wave radiated or transmitted by the probe antenna 108. This process can be repeated with a different (or separate) configuration scheme applied by the phased antenna array 106 each time. The probe antenna 108 can radiate or transmit the same electromagnetic wave (e.g., corresponding to the transmit RF signal) repeatedly. In other words, the plurality of electromagnetic waves transmitted by the probe antenna 108 can include (or represent) multiple transmissions of the same transmit RF signal at different time instances.

Causing the phased antenna array 106 to operate, during transmission of each electromagnetic wave of the plurality of electromagnetic waves, according to a corresponding configuration scheme can include activating the plurality of antenna elements 112 one at a time such that each antenna element is activated during transmission of a corresponding electromagnetic wave of the plurality of electromagnetic waves. Each configuration scheme can be indicative of a corresponding antenna element 112 of the plurality of antenna elements of the phased antenna array 106 to be activated. For instance, when operating as the transmitting antenna, the phased antenna array 106 may activate a first antenna element 112 and cause the activated first antenna element 112 to transmit a transmit RF signal while the reset of antenna elements 112 are deactivated. The phased antenna array 106 may then activate a second antenna element 112 (while deactivating the first antenna element 112) and cause the second antenna element 112 to transmit the transmit RF signal (or another transmit RF signal). The phased antenna array 106 may continue activating the antenna elements 112 one at a time and causing the activated antenna element 112 to transmit the transmit RF signal (or a corresponding transmit RF signal), for example, until all antenna elements 112 of the phased antenna array 106 have been activated and transmitted transmit RF signal(s).

When operating as the receiving antenna, the phased antenna array 106 may activate (e.g., based on instruction or command from the antenna testing control system 104) an antenna element 112 such that the activated antenna element 112 receives a first electromagnetic wave radiated by the probe antenna 108. The phased antenna array 106 may then activate another antenna element 112 (while deactivating the previously activated antenna element 112) such that the now activated antenna element 112 receives a second electromagnetic wave radiated by the probe antenna 108. The phased antenna array 106 may continue activating the antenna elements 112 one at a time and having each activated antenna element 112 receive an electromagnetic wave radiated by the probe antenna 108, for example, until all antenna elements 112 of the phased antenna array 106 have been activated.

Causing the phased antenna array 106 to operate, during transmission of each electromagnetic wave of the plurality of electromagnetic waves, according to a corresponding configuration scheme can include the phased antenna array 106 (e.g., based on instruction(s) or command(s) from the antenna testing control system 104) phase steering the plurality of antenna elements 112, during transmission of each electromagnetic wave, according to a respective phase coding scheme. Each phase coding scheme can define a corresponding set of phase shifts (or a corresponding set of time delays) applied to the plurality of antenna elements 112 during transmission of the corresponding electromagnetic wave. That is, each phase coding scheme can define for each antenna element 112 a corresponding phase shift (or a corresponding time delay) according to which that antenna element 112 is to operate. Each phase coding scheme may also define a set of power amplifications applied to the plurality of antenna elements 112 during transmission of the corresponding electromagnetic wave. That is, each phase coding scheme can define for each antenna element 112 a corresponding power amplification according to which that antenna element 112 is to operate.

For instance, when operating as the transmitting antenna, the phased antenna array 106 can phase steer the antenna elements 112 according to a first phase coding scheme and cause the antenna elements 112 to transmit a transmit RF signal while operating according to the first phase coding scheme. As such, the antenna elements 112 can simultaneously transmit various time delayed (or phase shifted) versions of the transmit RF signal that add up to form an electromagnetic wave radiated by the phased antenna array. The phased antenna array 106 can phase steer the antenna elements 112 according to a second phase coding scheme and cause the antenna elements 112 to transmit the transmit RF signal (or another transmit RF signal) while operating according to the second phase coding scheme. The phased antenna array 106 can continue phase steering the antenna elements 112 and causing the antenna elements 112 to transmit the transmit RF signal until all phase coding schemes are applied to the antenna elements 112. By applying various phase coding schemes when transmitting the transmit RF signal(s), the phased antenna array 106 can radiate a plurality of electromagnetic waves sequentially. The electromagnetic waves radiated by the phased antenna array 106 may be different from each other, for example, when distinct phase coding schemes are applied to the antenna elements 112.

When operating as the receiving antenna, the phased antenna array 106 can phase steer the antenna elements 112 according to a first phase coding scheme to receive an electromagnetic wave radiated by the probe antenna 108. While all antenna elements 112 are exposed to the same magnetic wave (radiated by the probe antenna 108), the antenna elements 112 can receive different phase shifted (or time delayed) versions of the electromagnetic wave (or a corresponding RF signal) given that different phase shifts (or time delays) can be applied to separate antenna elements 112. The phased antenna array 106 can phase steer the antenna elements 112 according to a second phase coding scheme to receive another electromagnetic wave radiated by the probe antenna 108. The phased antenna array 106 can continue phase steering the antenna elements 112 until all phase coding schemes (e.g., of a predefined set of coding schemes) are sequentially applied to the antenna elements 112 to receive a plurality of electromagnetic waves sequentially radiated by the probe antenna 108. The plurality of electromagnetic waves sequentially radiated by the probe antenna 108 may be associated with a single transmit RF signal that is repeatedly transmitted by the probe antenna 106, or may be associated with distinct transmit RF signals.

In some instances, causing the phased antenna array 106 to operate, during transmission of each electromagnetic wave of the plurality of electromagnetic waves, according to a corresponding configuration scheme can include can include activating a group of antenna elements of the plurality of antenna elements 112 and phase steering the antenna elements of the activated group. For instance, the phased antenna array 106 (whether operating as the transmitting antenna or the receiving antenna) can activate the plurality of antenna elements 112 one group (e.g., block of antenna elements) at a time. The phased antenna array 106 can sequentially apply to each activated group of antenna elements a corresponding plurality of phase coding schemes. For example, four distinct phase coding schemes may be sequentially applied to a group of four activated antenna elements 112. Each coding scheme defines the phase shifts (or time delays) and/or power amplifications to be applied to the antenna elements of the corresponding group of active antenna elements. Each configuration scheme can define a group of antenna elements to be activated and a phase coding scheme to be applied to that group of antenna elements. This approach, where each configuration scheme defines a corresponding group (or block) of antenna elements to be activated and a corresponding phase coding scheme to be applied to the group of active antenna elements, allows for testing blocks of antenna elements separately.

The method 300 can include the receiving antenna (the phased antenna array 106 or the probe antenna 108) receiving, responsive to each electromagnetic wave radiated by the transmitting antenna, a corresponding receive RF signal (BLOCK 308). When the phased antenna array 106 operates as the receiving antenna, the receive RF signal can be a summation of signals received by active antenna elements 112. For example, when the antenna elements 112 are activated one at a time, each receive RF signal can be a signal received by the corresponding active antenna element phased shifted (or time delayed) by any phase shift (or time delay) value associated the active antenna element 112 and/or amplified by an amplitude/power amplification value associated with the active antenna elements. When the antenna elements 112 are activated one group at a time, each receive RF signal can be a summation of phased shifted (or time delayed) and/or amplified versions (e.g., according to phase coding scheme applied to the group of antenna elements) of signals received by the corresponding active group of antenna elements. When separate phase coding schemes are applied to all the antenna elements 112, one phase coding scheme at a time, each receive RF signal can be a summation of phased shifted (or time delayed) and/or amplified versions (e.g., according to the phase coding scheme applied) of signals received by the plurality of antenna elements 112 of the phased antenna array 106. The phase shifting (or time delays) and/or the amplifications can be applied by the network of RF amplifiers and phase shifters (or time delay elements) of the phased antenna array 106 or by a processor (or controller) of the phased antenna array 106.

When the phased antenna array 106 operates as the transmitting antenna, each receive RF signal can represent the signal received by the probe antenna 108 (responsive to a corresponding electromagnetic wave radiated by the phased antenna array 106) amplified by any amplitude/power amplification associated with the probe antenna array 108. In the case where multiple probe antennas 108 acting as receiving antennas are used (e.g., as discussed with regard to FIGS. 1, 2A and 2B), the probe antennas 108 may receive electromagnetic waves simultaneously or sequentially (e.g., activated one at a time). Also, if a moving probing antenna 108 (e.g., as discussed with regard to FIG. 2C) is used as the receiving antenna, the probe antenna 108 may receive one or more radiated electromagnetic waves while in one location, move to another location to receive one or more other waves, then to a third location and so on and so forth. The probe antenna 108 may receive electromagnetic waves while moving. The antenna testing control system 104 can have access to the location of the moving probe antenna 108 (or the location of a moving phased antenna array 106) at each instance an electromagnetic wave is radiated by the transmitting antenna or received by the receiving antenna.

The method 300 can include determining, for each antenna element 112 of the plurality of antenna elements 112, a corresponding signal response using the receive RF signals (BLOCK 310). The antenna testing control system 104 can obtain a plurality of receive RF signals from the receiving antenna. As discussed above, each of the plurality of receive RF signals can be associated with a corresponding antenna element 112 (acting as a transmitter or as a receiver), a corresponding group of active antenna elements (acting as transmitters or as receivers) and a corresponding phase coding scheme applied to that group of active antenna elements, or a corresponding phase coding scheme applied to the plurality of antenna elements 112 (acting as transmitters or as a receivers) of the phased antenna array.

Assuming that the phased antenna array 106 has K (K is an integer) antenna elements and that N (N is an integer) receive RF signals obtained by the antenna testing control system 104, each receive RF signal $Y_i(\omega)$ (in the frequency domain) can be described as:

$$Y_i(\omega) = \Sigma_{k=1}^{K} W_{i,k} A_k X(\omega), \, i=1,\ldots,N. \quad (1)$$

The integer i represents an index of signal transmission (or reception) events by the transmitting antenna (or the receiving antenna) or an index of the receive RF signals. The integer k represents an index of the antenna elements 112 of the phased antenna array 106. The signal $X(\omega)$ represents the transmit RF signal (in the frequency domain) used by the transmitting antenna, and $\omega$ is the angular frequency. Each parameter $W_{i,k}$ can be a complex weighting parameter associated with the k-th antenna element and defined, for example, by the phase coding scheme applied during the i-th transmission/reception event. For instance, the complex weighting parameter $W_{i,k}$ can be indicative of the time delay (or phase shift) and/or power amplification applied by the phased antenna array 106 to the signal transmitted or received by the k-th antenna element during the i-th transmission/reception event. As used herein a transmission or reception event refers to a transmission (or a reception) of an electromagnetic wave by the transmitting antenna (or receiving antenna). The complex weighting parameters $W_{i,k}$ for all k=1, . . . , K and all i=1, . . . , N are known to the antenna testing control system 104 since these parameters can be predefined in the configuration schemes (or phase coding schemes) applied by the phased antenna array 106 during the various transmission/reception events. Each parameter $A_k$ can be a complex weighting parameter associated with the k-th antenna element that can be indicative of phase shift and signal attenuation due to the distance between the k-th antenna element and the phased antenna array, the gain of the probe antenna 108 at the direction of transmission or reception, the gain of the k-th antenna element at the direction of transmission or reception, or a combination thereof. For instance, the complex weighting parameter $A_k$ can be indicative of the time delay (or phase shift) and/or power amplification applied by the phased antenna array 106 to the signal transmitted or received by the k-th antenna element during the i-th transmission/reception event. The complex weighting parameters $A_k$ for k=1, . . . , K are the unknowns in the set of equations (1).

The formulation in the set of equations (1) illustrates that each receive RF signal $Y_i(\omega)$ can be expressed, in the frequency domain, as a weighted sum of the transmit RF signal $X(\omega)$. In the case where all the antenna elements 112 of the phased antenna array 106 are activated with a distinct phase coding scheme applied by the phased antenna array 106 during each of the transmission/reception events, the complex weighting parameters $A_k$ can be non-zero for all k=1, . . . , K, and the complex weighting parameters $W_{i,k}$ can be non-zero for all i=1, N and all k=1, . . . , K. In the case where the antenna elements 112 are activated one group at a time, the set of equations (1) can be re-written as $$Y_i(\omega) = \Sigma_{k \in S_i} W_{i,k} A_k X(\omega), \, i=1,\ldots,N, \quad (2)$$

where $S_i$ represents the set of indices for the active antenna elements during the i-th transmission/reception event. In the case where the antenna elements 112 are activated one at a time, the set of equations (1) reduces to $$Y_i(\omega) = W_{i,q(i)} A_{q(i)} X(\omega), \, i=1,\ldots,N, \quad (3)$$

where the integer q(i) represents the index of the active antenna element during the i-th transmission/reception event.

Since the transmit RF signal $X(\omega)$ and the complex weighting parameters $W_{i,k}$ are already known, the antenna testing control system 104 can solve for the complex weighting parameters $A_k$ using any of the sets of equations (1), (2), or (3) depending on the type of configuration schemes applied or implemented by the phased antenna array 106. For example, using equation (3), the antenna testing control system 104 can compute $A_{q(i)}$ as:

$$A_{q(i)} = \frac{Y_i(\omega)}{W_{i,q(i)} X(\omega)}, \, i=1,\ldots,N. \quad (4)$$

The antenna testing control system 104 can solve the set of equations (1) for the complex weighted parameters $A_k$ as long as N≥K and the N equations (1) are linearly independent. The phase coding schemes used can be selected or designed (e.g., by the antenna testing control system 104) such that the set of equations (1) are linearly independent with N≥K. For the set of equations (2), the antenna testing control system 104 can solve each subset of equations associated with a corresponding group of activated antenna elements separately given that the number of equations for each group (or block) $S_i$ of active antenna elements is greater than or equal to the number of antenna elements in that group (or block). The phase coding schemes associated with each group (or block) of antenna elements $S_i$ can be selected or designed (e.g., by the antenna testing control system 104) to be greater than the number of antenna elements in that group (or block) and such that the corresponding equations (among the set of equations (2)) are linearly independent.

Once the complex weighting parameters $A_k$ are determined, the antenna testing control system 104 can determine a signal response for each antenna element 112. The antenna testing control system 104 can remove from each complex weighting parameters $A_k$ the effect of the probe antenna gain (along the angle of arrival/departure of the received/transmitted electromagnetic wave), the time delay due to the electromagnetic wave propagation between the probe antenna and the k-th antenna element, and electromagnetic wave attenuation (if any) due to the electromagnetic wave propagation between the probe antenna and the k-th antenna element. For instance, the antenna testing control system 104 can compute a new set of complex weighting parameters $B_k$ such that $$B_k = \frac{A_k}{G_p(\theta, \varphi) \rho_k e^{j\omega\delta}}, \, k=1,\ldots,K, \quad (5)$$

where $G_p(\theta, \varphi)$ represents the gain of the probe antenna 108 along the angle of electromagnetic wave propagation, and the parameter $\rho_k e^{j\omega\delta}$ represents the amplitude attenuation and the phase shift due to electromagnetic propagation between the probe antenna 108 and the k-th antenna element. In some instances, the amplitude attenuation parameter $\rho_k$ can be equal to 1. The radiation pattern of the probe antenna 108 may be known in advance to the antenna testing control system 104. For instance, a representation of the radiation pattern of the probe antenna 108 may be stored in a memory accessible by the antenna testing control system 104. The antenna testing control system 104 can precompute the parameter $p_k e^{j\omega\delta}$ (for each antenna element with index k) based on the distance between the probe antenna 108 and the k-th antenna element.

The antenna testing control system 104 can determine the signal response for each antenna element as $B_k X(\omega)$. If the phased antenna array 106 is acting as the transmitting antenna, the signal response $B_k X(\omega)$ can be viewed as the RF signal radiated at the surface of the k-th antenna element when no weighting (e.g., as a phase shift and/or a power amplification) is applied at the phased antenna array 106 in association with the k-th antenna element. The complex weighting parameter $B_k$ can be viewed as representing a phase and amplitude response of the k-th antenna element. Hence, determining a signal response for each antenna element can include determining phase and amplitude responses (or phase and amplitude parameters) for each antenna element. The phase and amplitude responses defined by complex weighting parameter $B_k$ are independent of the probe antenna 108 and the distance between (or the positions of) the phased antenna array 106 and probe antenna 108. When a complex weighting $W_{i,k}$ (e.g., as phase shift and/or power amplification) is applied by the phased antenna array 106, the RF signal radiated at the surface of the k-th antenna element can be equal to $W_{i,k} B_k X(\omega)$. In the case where the phased antenna array 106 is acting as the receiving antenna, the signal response $B_k X(\omega)$ can be viewed as the RF signal received at the surface of the k-th antenna element before any weighting (e.g., as a phase shift and/or a power amplification) is applied at the phased antenna array 106 in association with the k-th antenna element.

In some instances, additional equations (similar to equations (1)) can be formulated, for example, when using multiple probe antennas 108. The multiple probe antennas 108 can be associated with distinct locations (as discussed with respect to FIG. 1), distinct polarizations (as discussed with regard to FIG. 2A), distinct operating center frequencies (as discussed with regard to FIG. 2B), or a combination thereof. In such instances, a separate set of equations (similar to the set of equations (1)) can be formulated for each probe antenna 108. Accordingly, the antenna testing control system 104 can solve multiple sets of equations and determine multiple signal responses (or multiple phase and amplitude responses) for each antenna element. For example, for a given antenna element, the antenna testing control system 104 can determine a signal response for each center frequency and/or for each wave polarization (e.g., Horizontal and vertical polarizations).

The method 300 can include determining one or more performance parameters of the phased antenna array 106 using the determined signal responses (or the determined phase and amplitude parameters) for the plurality of antenna elements 112. For instance, the antenna testing control system 104 can use the determined amplitude/phase response (or amplitude and phase parameters) for each of the antenna elements 112 to determine a far field response of the phased antenna array 106. The antenna testing control system 104 can use far field response of the phased antenna array 106 to determine the performance parameters of the phased antenna array 106.

In some instances, the antenna testing control system 104 can use the phase/amplitude responses of the antenna elements and an average individual antenna element radiation pattern (e.g., representative of the radiation pattern of each antenna element 112 assuming similarly behaving antenna elements 112) to determine the far field response (or radiation pattern) of the phased antenna array 106. For instance, the far field response (or radiation pattern) of the phased antenna array can be computed as a weighted sum of the average individual antenna element radiation pattern scaled by the phase/amplitude responses of the antenna elements 112.

Figure 4:
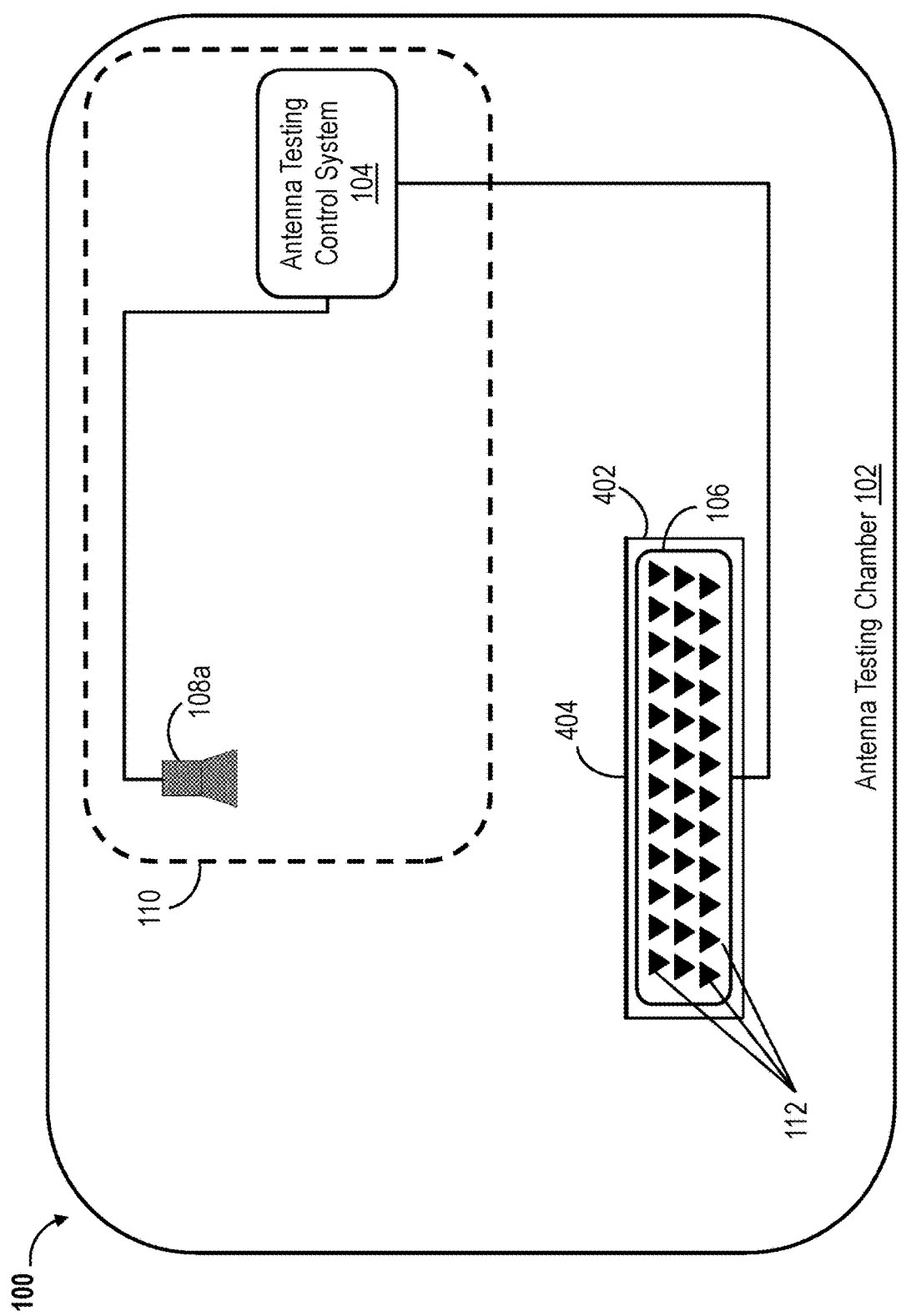
FIG. 4 shows a block diagram illustrating an approach for determining the far field response of ae phased antenna array 106 based on amplitude/phase responses for each of the antenna elements of the phased antenna array is shown, according to inventive concepts of this disclosure.

Referring to FIG. 4, a block diagram illustrating an approach for determining the far field response of the phased antenna array 106 based on amplitude/phase response (or amplitude and phase parameters) for each of the antenna elements 112 is shown, according to inventive concepts of this disclosure. By determining the phase/amplitude response for each antenna element, the antenna testing control system 104 can determine the electric (or magnetic) field and/or electric current over a closed surface 402 around the phased antenna array. In particular, the electric (or magnetic) field and/or electric current over the closed surface 402 are non-zero only over the portion 404 of the closed surface 402 that is facing (or in front of) the antenna elements 112 since electromagnetic waves radiated by the antenna elements 112 do not propagate along the sides or the back of the phased antenna array 106.

According to the surface equivalence principle (or surface equivalence theorem), if the fields/currents are uniquely known over a closed surface (e.g. two of the electric field E, magnetic field H, the magnetic flux density B vector, or the current density vector J) then the fields/currents everywhere inside or outside of the volume defined by the closed surface can be uniquely identified or determined. Accordingly, the antenna testing control system 104 can, for example, determine the electric field E and the current density J vector based on the portion 404 of the closed surface 402 based on the determined amplitude/phase response for each antenna element 112 of the phased antenna array 106. The antenna testing control system 104 can set the electric field E and the current density J vector to zero on the rest of the closed surface 402. The antenna testing control system 104 can then apply a Fourier transform to the determined phase/amplitude responses of the antenna elements 112 to determine a far field response of the phased antenna array 106 according to the surface equivalence principle.

Figure 5:
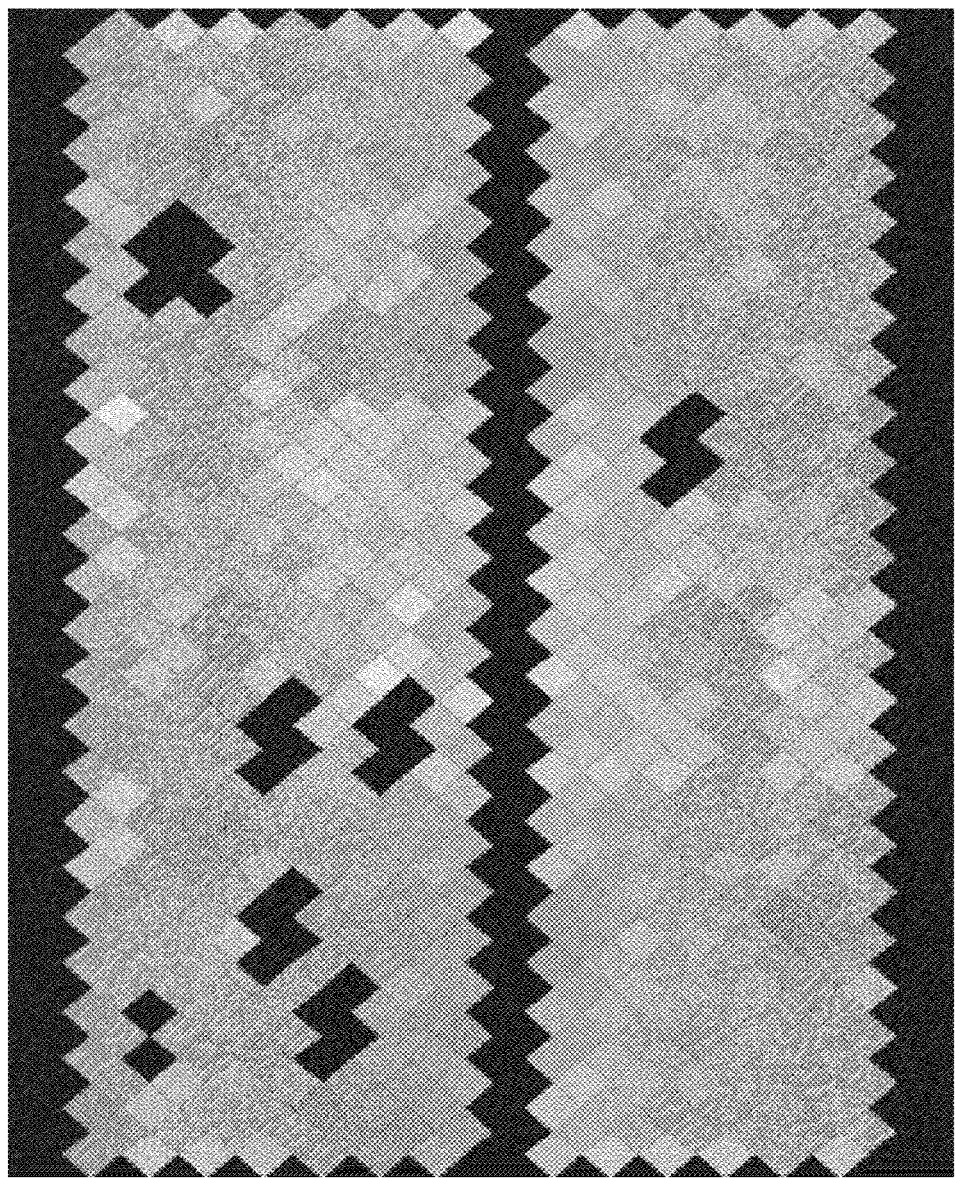
FIG. 5 shows example simulation results illustrating phase/amplitude responses of the antenna elements of the phased antenna array is shown, according to inventive concepts of this disclosure.

Referring to FIG. 5, example simulation results illustrating phase/amplitude responses of the antenna elements 112 of the phased antenna array 106 are shown, according to inventive concepts of this disclosure. Each diamond shaped cell represents a corresponding antenna element 112 of the phased antenna array 106.

Figure 6:
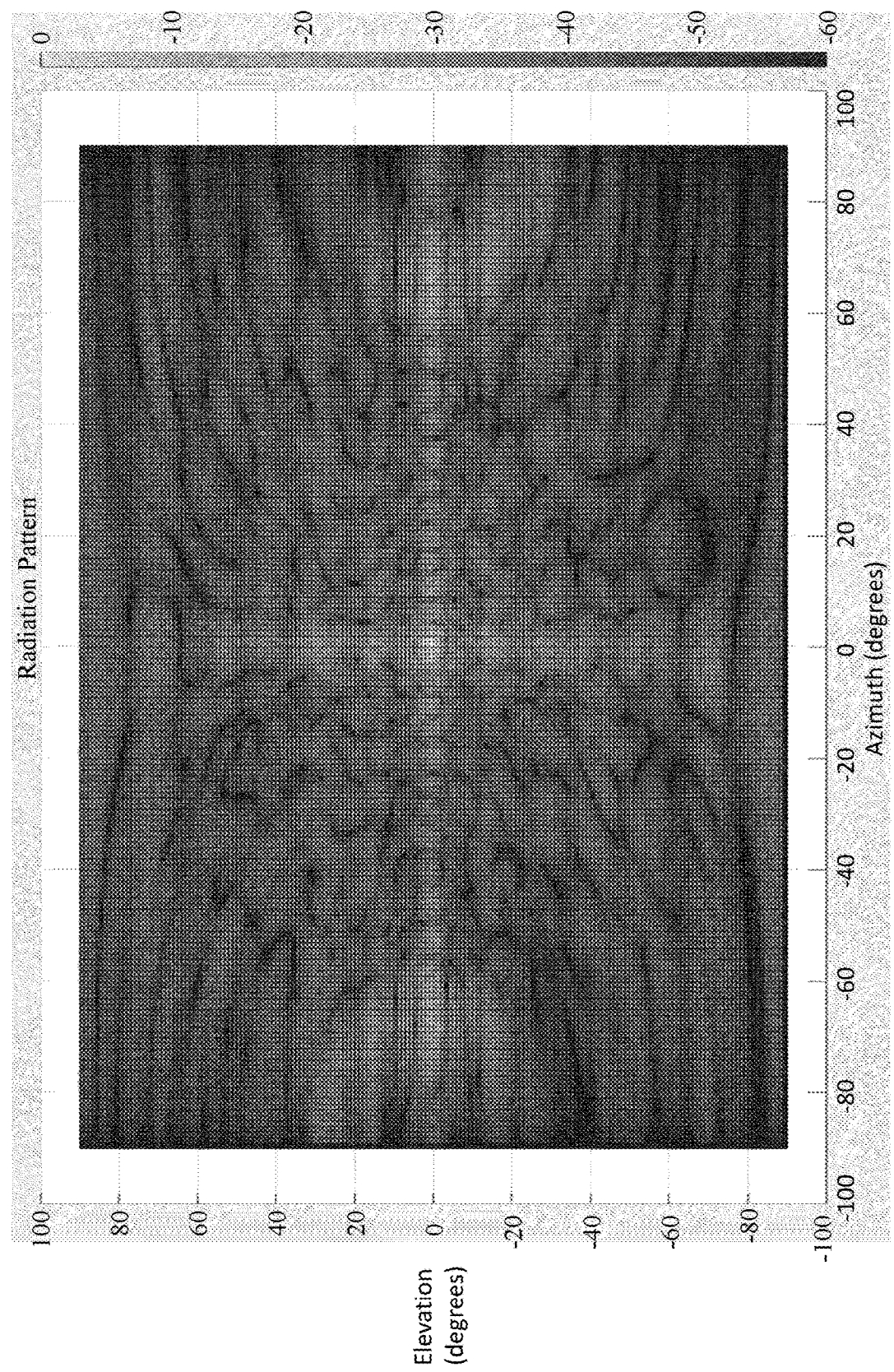
FIG. 6 shows an example far field response of the phased antenna array determined using the antenna elements' phase/amplitude responses shown in FIG. 5 is shown, according to inventive concepts of this disclosure.

Referring to FIG. 6, an example far field response of the phased antenna array 106 determined using the antenna elements' phase/amplitude responses shown in FIG. 5 is shown, according to inventive concepts of this disclosure. The far field response shown in FIG. 6 represents a radiation pattern of the phased antenna array 106 along an azimuth angle range between −100 and 100 degrees and an elevation angle range between −100 and 100 degrees.

When the phased antenna array 106 applies phase shifts (or time delays) and/or power amplifications to the antenna elements 112 defined by the complex weighting parameters $V_k$ (or $W_{i,k}$), for k=1, . . . , K, the antenna testing control system 104 can incorporate these complex weighting parameters into the phase/amplitude responses of the antenna elements 112, for example, as $V_k B_k$ (or $W_{i,k} B_k$). By determining the electric (or magnetic) fields/currents over the closed surface 402 based on the phase/amplitude responses $V_k B_k$ (or $W_{i,k} B_k$), the antenna testing control system 104 can use the Fourier transform to determine the far field response (or radiation pattern) of the phased antenna array 106 when phase steered according to the complex weighting parameters $V_k$ (or $W_{i,k}$), for k=1, . . . , K.

Based on the determined radiation patter of the phased antenna array 106, the antenna testing control system 104 can determine one or more other performance parameters of the phased antenna array including the phased antenna array gain (e.g., co-polarized gain and cross-polarized gain), the co-polarized phased antenna array directivity (e.g., co-polarized directivity and cross-polarized directivity), the phased antenna array beamwidth, the radiated power, the cross-polarization discrimination, the antenna gain-to-noise-temperature, the error vector magnitude, the adjacent channel power ratio, the pulse quality, one or more side lobe levels, signal-to-noise ratio (SNR), or a combination thereof. For instance, the antenna testing control system 104 can determine the peak phased antenna gain based on the peak value (at the main lobe) of radiation pattern of the phased antenna array 106. To determine the co-polarized gain and cross-polarized gain, two probe antennas 108 with distinct polarizations (as discussed with regard to FIG. 2A) can be used. One probe antenna 108 can be polarized similar the phased antenna array 106 (e.g., both with horizontal polarizations) and another probe antenna with cross-polarization (e.g., vertical polarization when the phased antenna array has horizontal polarization). The antenna testing control system 104 can determine a co-polarized far field response and cross-polarized far field response of the phased antenna array 106. The antenna testing control system 104 can determine the co-polarized gain using the determined co-polarized far field response, and determine the cross-polarized gain using the determined cross-polarized far field response of the phased antenna array.

The antenna testing control system 104 can determine the directivity as:

$$D = \frac{1}{\frac{1}{4\pi} \int_0^{2\pi} \int_0^{\pi} |F(\theta, \varphi)| \sin\theta d\theta d\varphi}, \quad (6)$$

where $F(\theta,\varphi)$ represents the far field response of the phased antenna array 106 along the elevation angle θ and azimuth angle φ. To determine the co-polarized directivity and the cross-polarized directivity, the antenna testing control system 104 can evaluate equation (6) for the co-polarized far field response of the phased antenna array 106 and the cross-polarized far field response of the phased antenna array 106 separately.

The antenna beamwidth of the phased antenna array 106 can be defined as the half power beamwidth or the null to null beamwidth. The antenna testing control system 104 can determine the angular separation in which the magnitude of the radiation pattern decreases by 50% (or 3 dB) from the peak of the main lobe in the case of the half power beamwidth. The antenna testing control system 104 can determine the angular separation in which the magnitude of the radiation pattern decreases zero from the peak of the main lobe in the case of the null to null beamwidth. The antenna testing control system 104 can determine the radiated power as the summation of the radiated powers of each of the antenna elements 112. The antenna testing control system 104 can also determine the cross-polarization discrimination, the antenna gain-to-noise-temperature, the error vector magnitude, the adjacent channel power ratio, the pulse quality, one or more side lobe levels, and the signal-to-noise ratio (SNR) using the determined radiation pattern(s) of the phased antenna array and/or the determined phase/amplitude responses (or phase/amplitude parameters) of the phased antenna array 106.

Figure 7:
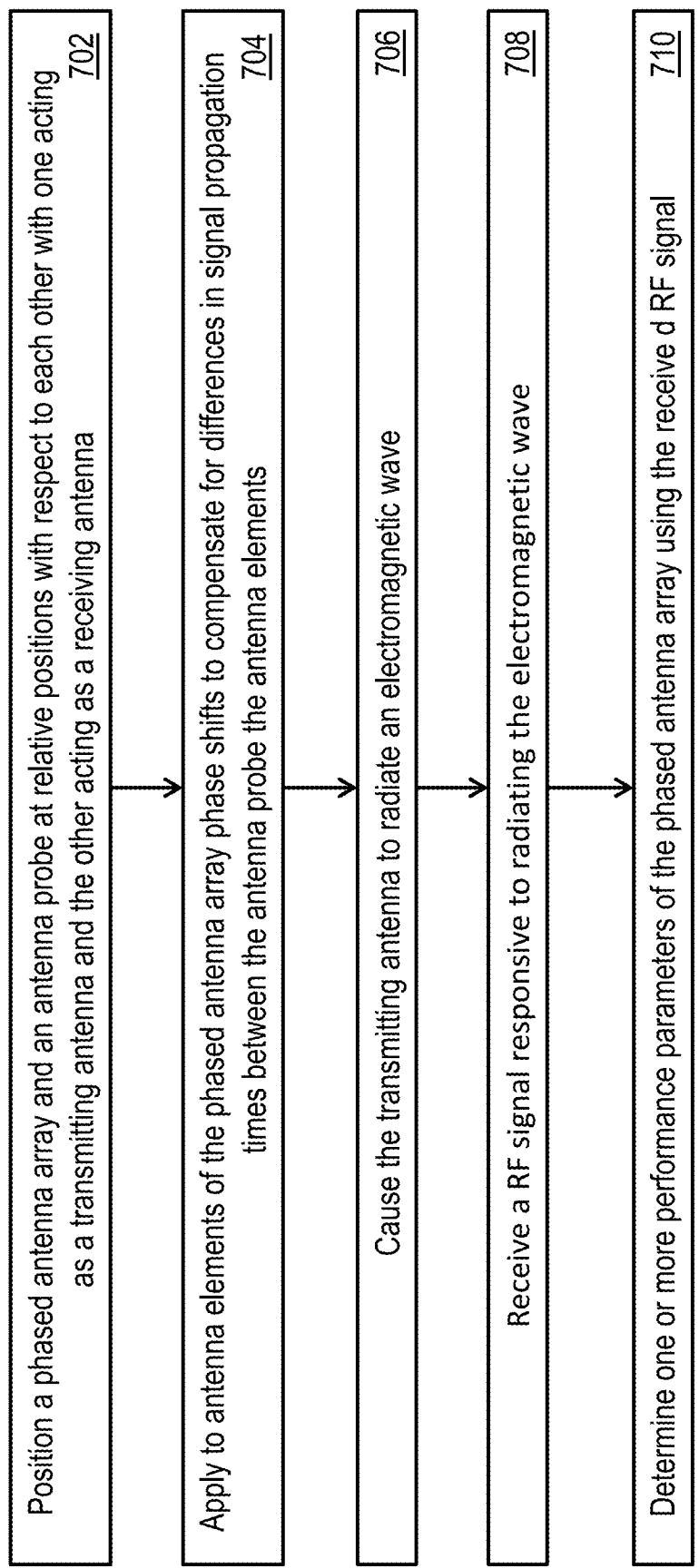
FIG. 7 shows a flowchart illustrating another method 700 of testing phased antenna arrays according to inventive concepts of this disclosure.

Referring to FIG. 7, a flowchart illustrating another method 700 of testing phased antenna arrays is shown, according to inventive concepts of this disclosure. In brief overview, the method 700 can include positioning a phased antenna array and an antenna probe at relative positions with respect to each other with one of them acting as a transmitting antenna and the other acting as a receiving antenna (BLOCK 702), and applying to antenna elements of the phased antenna array phase shifts to compensate for differences in signal propagation times between the antenna probe the antenna elements (BLOCK 704). The method 700 can include causing the transmitting antenna to radiate an electromagnetic wave (BLOCK 706), receiving a RF signal responsive to radiating the electromagnetic wave (BLOCK 708), and determining one or more performance parameters of the phased antenna array using the received RF signal (BLOCK 710).

The step 702 of method 700 can be similar to step 302 of method 300 described above. The method 700 can also include the antenna testing control system causing the phased antenna array 106 to apply to the antenna elements 112 phase shifts to compensate for differences in signal propagation times between the antenna probe 108 and the antenna elements 112 (BLOCK 704). That is, the phase shifts are applied such that signals transmitted by the antenna elements 112 add up constructively at the receiving probe antenna 108, or signals received by the antenna elements 112 add up constructively at the receiving phased antenna array 106. For instance, the phase shift (or time delay) applied to each antenna element may be selected (e.g., by the antenna testing control system 104) to compensate for the propagating time between the probe antenna and that antenna element 112. Applying phase shifts to the antenna elements 112 to compensate for differences in signal propagation times between the antenna probe 108 and the antenna elements 112 can cause the peak of the main lobe of the phased antenna array 106 to be aligned with the probe antenna 108.

The steps 706 and 708 of method 700 can be similar to the steps 304 and 308 of method 300 described above, except that the antenna testing control system 104 can cause the phased antenna array 106 to increment (or modify) the phase shifts already applied to antenna elements 112 by a common phase offset, and perform another transmission reception event. Such phase offset can cause the peak of the main lobe (or the main lobe) of the phased antenna array 06 to rotate by a predefined angle. The antenna testing control system 104 can repeat incrementing or modifying the phase shifts (or time delays) applied to the antenna elements 112 by the same (or another) phase offset value or (or offset calibration) to further tilt (or rotate) the radiation pattern of the phased antenna array 106. For example, referring back to FIG. 1, the offset calibrations can cause the peak of the main lobe (or the main lobe) of the phased antenna array 106 to be aligned with a new position point 116 with each offset calibration. Such approach can allow for determining the far field response at various angles. For each receive RF signal (associated with a corresponding offset calibration), the gain of the phased antenna array 106 (or the far field response) along an orientation angle (with respect to the peak of the main lobe of the radiation pattern of the phased antenna array 106) associated with calibrated phases of the antenna elements can be determined as $$G_A = G_R \frac{P_A}{P_R}. \quad (7)$$

where $G_A$ is the gain (or far field response) of the phased antenna array along the orientation angle, $G_R$ is the gain (or far field response) along the same orientation angle of a reference (or standard gain) antenna, $P_A$ is received power of the phased antenna array 106, and $P_R$ is the received power of the reference antenna. The gain $G_R$ and the power and $P_R$ for each orientation angle can be known to (or accessible to) the antenna testing control system 104, and the power $P_A$ f the phased antenna array 106 can be computed for each phase calibration (or orientation of the radiation pattern of the phased antenna array 106) based on, for example, the corresponding received (or transmitted) signal by the phased antenna array. Accordingly, the antenna testing control system 104 sample the radiation pattern of the phased antenna array 106 by applying the phase offset calibrations.

Using the measured samples of the radiation pattern (or far field response) of the phased antenna array 106, the antenna testing control system 104 can determine one or more performance parameters of the phased antenna array 106. For example, the antenna testing control system 104 can determine the performance parameters including the phased antenna array gain (e.g., co-polarized gain and cross-polarized gain), the co-polarized phased antenna array directivity (e.g., co-polarized directivity and cross-polarized directivity), the phased antenna array beamwidth, the radiated power, the cross-polarization discrimination, the antenna gain-to-noise-temperature, the error vector magnitude, the adjacent channel power ratio, the pulse quality, one or more side lobe levels, signal-to-noise ratio (SNR), or a combination thereof, using the measured radiation pattern (or samples thereof) as discussed above with regard to FIG. 3. By applying the phase offset calibrations, the antenna testing control system 104 can determine the far field response of the phased antenna array 106 without necessarily scanning the beam anywhere near the probe antenna 108.

Figure 8:
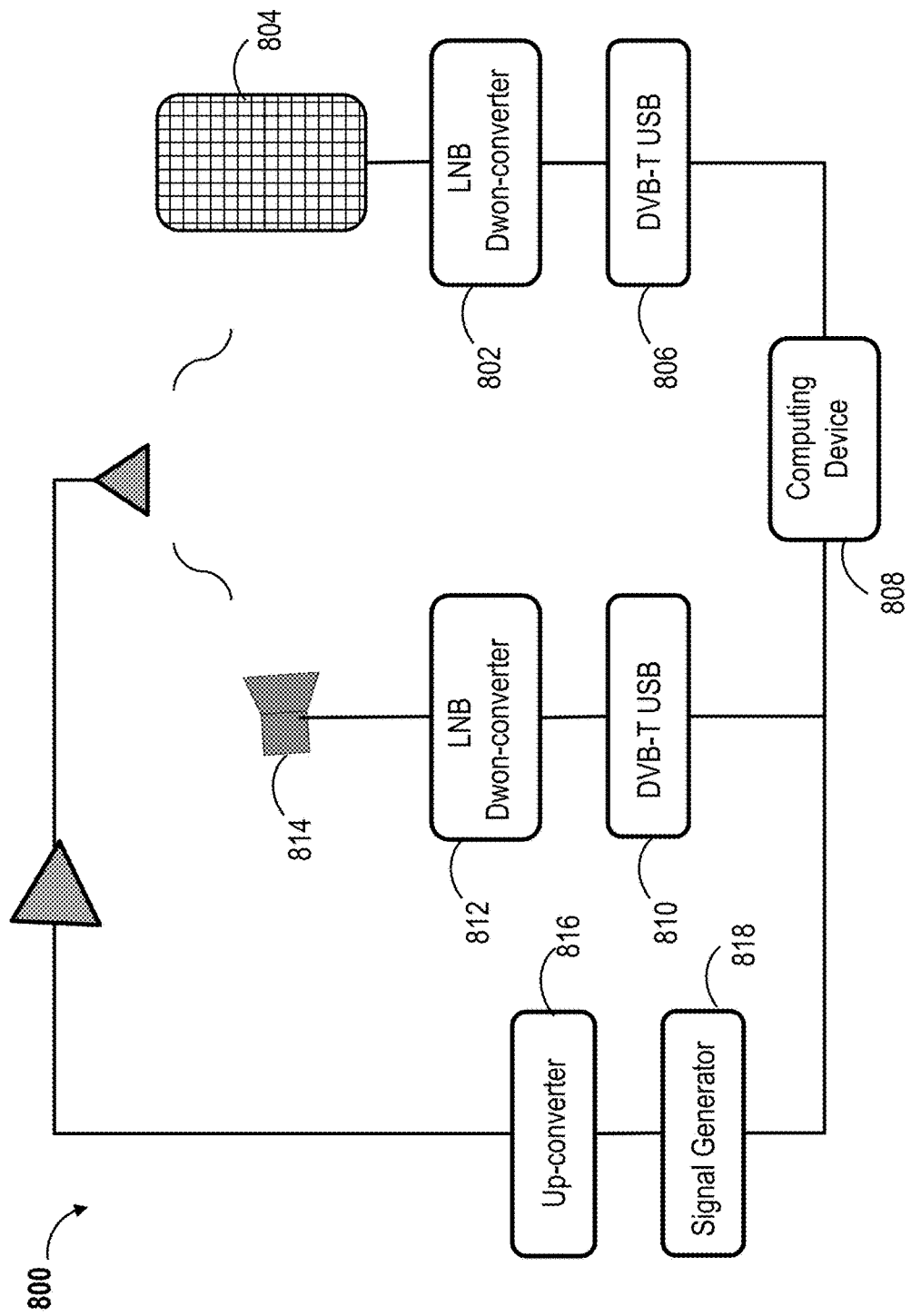
FIG. 8 shows a block diagram of a phased antenna array testing system, according to inventive concepts of this disclosure.

Referring to FIG. 8, a block diagram of a phased antenna array testing system 800 is shown, according to inventive concepts of this disclosure. While conventional testing systems typically employ a network analyzer which is considered as a complex and expensive equipment, the system 800 can include a first low noise block (LNB) down-converter 802 (e.g., a circuit) to down-convert signals received from phased antenna array 804 to an intermediate frequency. The system 800 can include a first DVB-T USB device 806 and a computing device 808. The first DVB-T USB device 806 can couple the first (LNB) down-converter 802 to the computing device 808.

The computing device 808 can include, for example, a laptop, a desktop, a hardware server, a tablet, a mobile device, or a printed circuit board. The computing device 808 can be configured (e.g., through executable software instructions) to perform tasks and processes described above as performed by the antenna testing control system 104, such as controlling and monitoring phase steering of the phased antenna array, processing receive RF signals, determining performance parameters of the phased antenna array, or a combination thereof. The computing device 808 can be communicatively coupled through a second DVB-T USB device 810 and a second low noise block (LNB) down-converter 812 (e.g., a circuit) to the probe antenna 814. The second low noise block (LNB) down-converter 812 can down-convert receive signals obtained by the probe antenna 814 to an intermediate frequency.

The system 800 can include a signal generator circuit 816 for generating, for example, baseband transmit RF signals. The signal generator circuit 816 can be communicatively coupled to the computing device 808, for example, to receive instructions from the computing device 808 and/or provide copies of generated baseband transmit RF signals to the computing device 808. The signal generator circuit (or device) 816 can be communicatively coupled to the transmitting antenna (phased antenna array 804 or the probe antenna 814 through an up-converter block (or circuit) 818. The up-converter block 816 can up-convert signals provided by the signal generator circuit 816 to an intermediate (or high) frequency, and provided the up-converted signals to the transmitting antenna.

Figure 9:
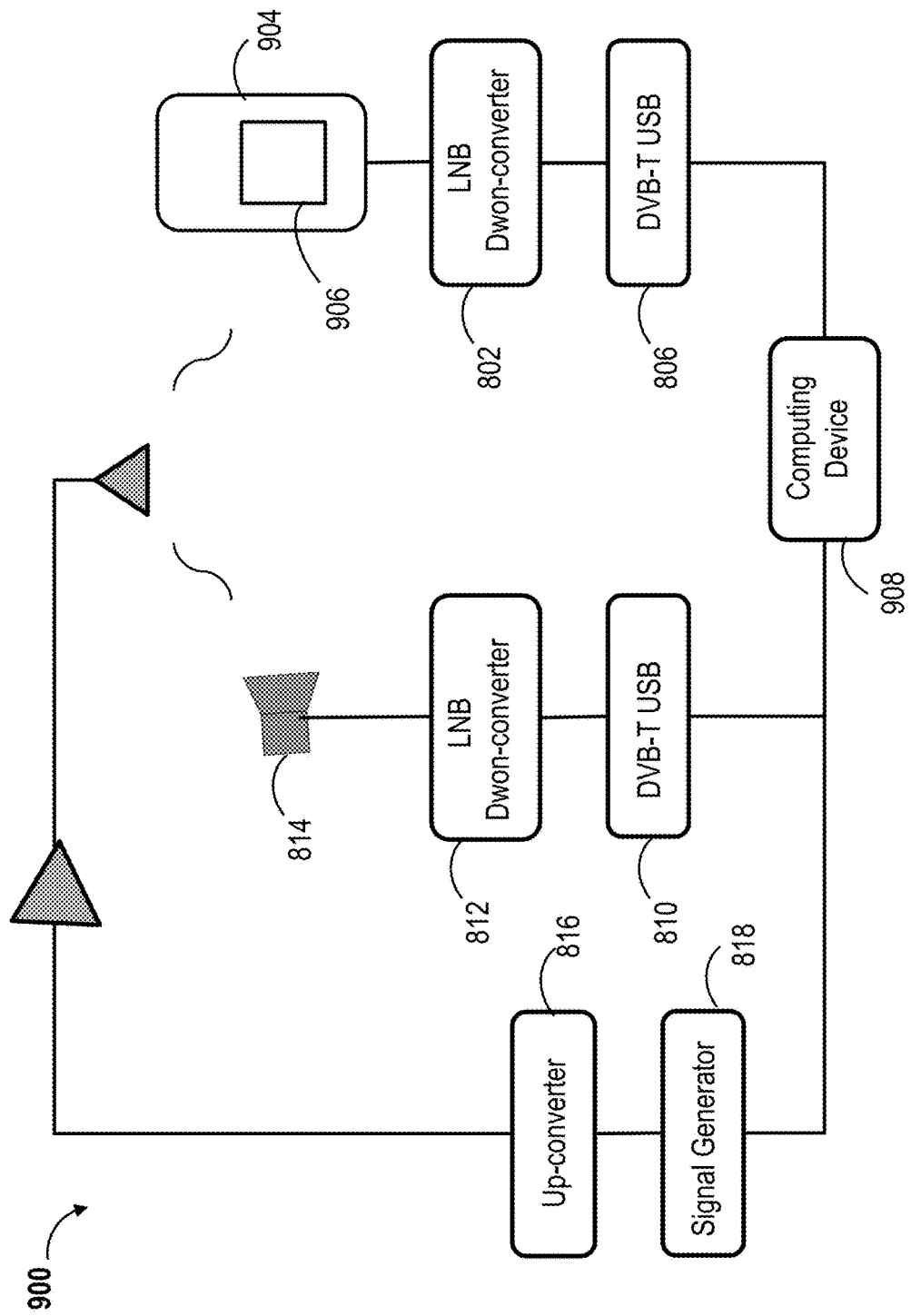
FIG. 9 shows a block diagram of another phased antenna array testing system, according to inventive concepts of this disclosure.

Referring to FIG. 9, a block diagram of another phased antenna array testing system 900 is shown, according to inventive concepts of this disclosure. The system 900 can be similar to the system 800 except that the computing device 808 in system 800 is replaced with a USB hub 902 that is communicatively coupled the phased antenna array 904, and the phased antenna array includes a processor 906 that is configured to perform the tasks or operating performed by the computing device 808 in system 800. Specifically, the processor 906 can be configured (e.g., through executable software instructions) to perform tasks and processes described above as performed by the antenna testing control system 104, such as controlling and monitoring phase steering of the phased antenna array 904, processing receive RF signals, determining performance parameters of the phased antenna array 904, or a combination thereof.

The construction and arrangement of the systems and methods are described herein as illustrative examples and are not to be construed as limiting. Although only a few embodiments have been described in detail in this disclosure, many modifications are possible (e.g., variations in sizes, dimensions, structures, shapes and proportions of the various elements, values of parameters, mounting arrangements, use of materials, colors, orientations). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method of operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

What is claimed is:

1. A method of testing phased antenna arrays, the method comprising:
   positioning a phased antenna array including a plurality of antenna elements and a probe antenna at relative positions with respect to each other, either the phased antenna array acting as a transmitting antenna and the probe antenna acting as a receiving antenna, or the probe antenna acting as the transmitting antenna and the phased antenna array acting as the receiving antenna;

causing the transmitting antenna to radiate a plurality of electromagnetic waves sequentially, the plurality of electromagnetic waves corresponding to a single transmit signal;

causing the phased antenna array to operate, during transmission of each electromagnetic wave of the plurality of electromagnetic waves according to a corresponding configuration scheme of a plurality of distinct configuration schemes, the corresponding configuration scheme defining at least one of a respective set of antenna elements that are active during the transmission of the electromagnetic wave, or a respective set of phase shifts or time delays that are applied to the plurality of antenna elements during the transmission of the electromagnetic wave;

receiving, by the receiving antenna, responsive to each radiated electromagnetic wave, a corresponding receive radio frequency (RF) signal;

determining, for each antenna element of the plurality of antenna elements, corresponding amplitude and phase parameters using the receive RF signals corresponding to the plurality of electromagnetic waves, each of the receive RF signals representing a corresponding linear combination of the single transmit signal; and determining one or more performance parameters of the phased antenna array using the determined amplitude and phase parameters for the plurality of antenna elements.

2. The method of claim 1 comprising:
positioning the probe antenna at a near field location relative to the phased antenna array.

3. The method of claim 1, wherein the one or more performance parameters include at least one of:
co-polarized antenna gain;
cross-polarized antenna gain
co-polarized antenna directivity;
cross-polarized antenna directivity;
antenna beam width;
radiated power;
cross-polarization discrimination;
antenna gain-to-noise-temperature;
error vector magnitude;
adjacent channel power ratio;
pulse quality;
one or more side lobe levels; and
signal-to-noise ratio (SNR).

4. The method of claim 1 comprising:
determining a far field response of the phased antenna array using the determined amplitude and phase parameters for each of the plurality of antenna elements.

5. The method of claim 1, wherein causing the phased antenna array to operate according to a corresponding configuration scheme includes:
activating the plurality of antenna elements one at a time such that each antenna element is activated to:
transmit an electromagnetic wave of the plurality of electromagnetic waves, wherein the probe antenna receives, responsive to transmission of the electromagnetic wave by the antenna element, the corresponding receive RF signal; or receive, responsive to transmission of an electromagnetic wave of the plurality of electromagnetic waves by the probe antenna, the corresponding receive RF signal.

6. The method of claim 5 comprising:
determining, for each antenna element of the plurality of antenna elements, the corresponding amplitude and phase parameters using the corresponding receive RF signal received during activation of the antenna element.

7. The method of claim 1, wherein causing the phased antenna array to operate according to a corresponding configuration scheme includes:
phase steering the plurality of antenna elements, during transmission of each electromagnetic wave of the plurality of electromagnetic waves, according to the respective set of phase shifts or time delays.

8. The method of claim 7 comprising:
transmitting each electromagnetic wave of the plurality of electromagnetic waves by the plurality of antenna elements phase steered according to the respective set of phase shifts or the respective set of time delays, the probe antenna reeiving, responsive to transmission of the electromagnetic wave by the plurality of antenna elements, the corresponding receive RF signal; or transmitting each electromagnetic wave of the plurality of electromagnetic waves by the probe antenna and the phased antenna array receiving, responsive to transmission of the electromagnetic wave by the probe antenna, the corresponding receive RF signal.

9. The method of claim 1, wherein causing the phased antenna array to operate according to a corresponding configuration scheme includes:
phase steering a group of active antenna elements of the plurality of antenna elements, during transmission of each electromagnetic wave of the plurality of electromagnetic waves, according to the respective set of phase shifts or time delays.

10. The method of claim 1 further comprising modifying the relative positions by causing the probe antenna or the phased antenna array to move along a predefined path during transmission of the plurality of electromagnetic waves.

11. The method of claim 1 comprising:
positioning at least two antenna probes with distinct polarizations; or
positioning a single dual polarized antenna probe.

12. The method of claim 1 comprising:
positioning a plurality of probe antennas operating at different center frequencies at various positions relative to the phased antenna array.

13. The method of claim 1 further comprising:
applying a predefined phase offset to the plurality of antenna elements; and
receiving one or more additional receive signals at an angle offset with respect to a main lobe of the receiving antenna.

14. A system for testing phased antenna arrays, the system comprising:
a signal generator circuit, communicatively coupled to a phased antenna array including a plurality of antenna elements or a probe antenna positioned at a relative position with respect to the phased antenna array, to generate one or more transmit radio frequency (RF) signals for transmission by the phased antenna array or the probe antenna, either the phased antenna array acting as a transmitting antenna and the probe antenna acting as a receiving antenna, or the probe antenna acting as the transmitting antenna and the phased antenna array acting as the receiving antenna; and a processor communicatively coupled to the signal generator circuit, the phased antenna array, and the probe antenna, the processor configured to:
cause the transmitting antenna to sequentially radiate a plurality of electromagnetic waves associated with the one or more transmit RF signals, the plurality of electromagnetic waves corresponding to a single transmit signal;
cause the phased antenna array to operate, during transmission of each electromagnetic wave of the plurality of electromagnetic waves according to a corresponding configuration scheme of a plurality of distinct configuration schemes, the corresponding configuration scheme defining at least one of a respective set of antenna elements that are active during the transmission of the electromagnetic wave or a respective set of phase shifts or time delays that are applied to the plurality of antenna elements during the transmission of the electromagnetic wave;
obtain, from the receiving antenna, responsive to each radiated electromagnetic wave, a corresponding receive RF signal, the receive RF signal received by the receiving antenna responsive to the radiated electromagnetic wave;
determine, for each antenna element of the plurality of antenna elements, corresponding amplitude and phase parameters using the receive RF signals corresponding to the plurality of electromagnetic waves, each of the receive RF signals representing a corresponding linear combination of the single transmit signal; and
determine one or more performance parameters of the phased antenna array using the determined amplitude and phase parameters for the plurality of antenna elements.

15. The system of claim 14, wherein the processor is embedded within the phased antenna array.

16. The system of claim 14, wherein the probe antenna is positioned at a near field location relative to the phased antenna array.

17. The system of claim 14, wherein the one or more performance parameters include at least one of:
co-polarized antenna gain;
cross-polarized antenna gain
co-polarized antenna directivity;
cross-polarized antenna directivity;
antenna beam width;
radiated power;
cross-polarization discrimination;
antenna gain-to-noise-temperature;
error vector magnitude;
adjacent channel power ratio;
pulse quality;
one or more side lobe levels; and
signal-to-noise ratio (SNR).

18. The system of claim 14, wherein the processor is configured to:
determine a far field response of the phased antenna array using the determined amplitude and phase parameters for each of the plurality of antenna elements.

19. The system of claim 14, wherein in causing the phased antenna array to operate according to a corresponding configuration scheme, the processor is configured to:
phase steer the plurality of antenna elements, during transmission of each electromagnetic wave of the plurality of electromagnetic waves, according to the respective set of phase shifts or time delays;
phase steer a group of active antenna elements of the plurality of antenna elements, during transmission of each electromagnetic wave of the plurality of electromagnetic waves, according to the respective set of phase shifts or time delays; or
activate the plurality of antenna elements one at a time such that each antenna element is activated to:
transmit an electromagnetic wave of the plurality of electromagnetic waves, wherein the probe antenna receives, responsive to transmission of the electromagnetic wave by the antenna element, the corresponding receive RF signal; or
receive, responsive to transmission of an electromagnetic wave of the plurality of electromagnetic waves by the probe antenna, the corresponding receive RF signal.

20. The system of claim 14, wherein the probe antenna includes:
a single dual polarized antenna probe;
at least two antenna probes with distinct polarizations positioned at relative positions with respect to the phased antenna array; or
a plurality of probe antennas operating at different center frequencies positioned at various positions relative to the phased antenna array.

* * * * *